(12) United States Patent
Goto et al.

(10) Patent No.: US 8,874,985 B2
(45) Date of Patent: Oct. 28, 2014

(54) COMMUNICATION SYSTEM, TRANSMISSION DEVICE, RECEPTION DEVICE, PROGRAM, AND PROCESSOR

(75) Inventors: Jungo Goto, Osaka (JP); Hiroki Takahashi, Osaka (JP); Osamu Nakamura, Osaka (JP); Kazunari Yokomakura, Osaka (JP); Yasuhiro Hamaguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/643,495

(22) PCT Filed: Apr. 14, 2011

(86) PCT No.: PCT/JP2011/059288
§ 371 (c)(1),
(2), (4) Date: Oct. 25, 2012

(87) PCT Pub. No.: WO2011/136033
PCT Pub. Date: Nov. 3, 2011

(65) Prior Publication Data
US 2013/0039405 A1 Feb. 14, 2013

(30) Foreign Application Priority Data
Apr. 30, 2010 (JP) .................. 2010-105157

(51) Int. Cl.
*H04L 1/18* (2006.01)
*H03M 13/29* (2006.01)
*H04L 1/00* (2006.01)
*H03M 13/00* (2006.01)
*H03M 13/09* (2006.01)

(52) U.S. Cl.
CPC ......... *H03M 13/2957* (2013.01); *H04L 1/0041* (2013.01); *H03M 13/6306* (2013.01); *H04L 1/0066* (2013.01); *H03M 13/296* (2013.01); *H04L 1/1819* (2013.01); *H03M 13/09* (2013.01)
USPC ........................................................ 714/749

(58) Field of Classification Search
CPC ..... H04L 1/1887; H04L 1/1812; H04L 1/188; H04L 1/1671; H04L 1/1854
USPC ........................................................ 714/749
See application file for complete search history.

(56) References Cited

U.S. PATENT DOCUMENTS 6,512,758 B1 1/2003 Sato et al.
7,076,720 B1 7/2006 Yoshida et al.
(Continued)

FOREIGN PATENT DOCUMENTS

JP 10-262281 A 9/1998
JP 11-17650 A 1/1999
(Continued)

OTHER PUBLICATIONS

Berrou et al., "Near Shannon Limit Error—Correcting Coding and Decoding: Turbo-Codes (1)", in Proc. ICC '93, May 1993, pp. 1064-1070.

(Continued)

*Primary Examiner* — Albert Decady
*Assistant Examiner* — Enam Ahmed
(74) *Attorney, Agent, or Firm* — Birch, Stewart, Kolasch & Birch, LLP

(57) ABSTRACT

A coding scheme selection unit outputs bits of a signal in a past reception to a second coding unit and outputs bits of a retransmission signal to a third coding unit. The second coding unit decodes bits. The third coding unit codes bits with a different constraint length from a constraint length in the second coding unit.

11 Claims, 27 Drawing Sheets

(56) References Cited

U.S. PATENT DOCUMENTS

| | | | |
|---|---|---|---|
| 8,194,786 B2* | 6/2012 | Loh et al. | 375/299 |
| 2002/0089965 A1* | 7/2002 | Kim | 370/342 |
| 2003/0167433 A1* | 9/2003 | Wengerter et al. | 714/749 |
| 2004/0010744 A1* | 1/2004 | Chen et al. | 714/755 |
| 2006/0262869 A1 | 11/2006 | Yoshida | |
| 2007/0250760 A1* | 10/2007 | Li | 714/786 |
| 2009/0141834 A1 | 6/2009 | Imamura et al. | |
| 2009/0175369 A1 | 7/2009 | Atarashi et al. | |
| 2010/0325505 A1 | 12/2010 | Shimezawa et al. | |

FOREIGN PATENT DOCUMENTS

| | | |
|---|---|---|
| JP | 11-205279 A | 7/1999 |
| JP | 11-261534 A | 9/1999 |
| JP | 2001-28548 A | 1/2001 |
| JP | 2002-26879 A | 1/2002 |
| JP | 2006-325063 A | 11/2006 |
| JP | 2007-214824 A | 8/2007 |
| WO | WO 2007/136056 A1 | 11/2007 |
| WO | WO 2009/104683 A1 | 8/2009 |

OTHER PUBLICATIONS

International Search Report for PCT/JP2011/059288 dated May 17, 2011.

Takeshita et al., "A Note on Asymmetric Turbo-Codes", IEEE Communications Letters, vol. 3, No. 3, Mar. 1999, pp. 69-71.

* cited by examiner

FIG. 9

| TRANSMISSION TYPE | CONSTRAINT LENGTH |
|---|---|
| INITIAL TRANSMISSION | 4 |
| RETRANSMISSION | 3 |

FIG. 10

| NUMBER OF TRANSMISSIONS | CONSTRAINT LENGTH |
|---|---|
| 1~2 | 4 |
| 3~ | 3 |

FIG. 24

| NUMBER OF USERS | CONSTRAINT LENGTH |
|---|---|
| 1~2 | 4 |
| 3 | 3 |

FIG. 28

| NUMBER OF TRANSMISSIONS | CONSTRAINT LENGTH |
|---|---|
| 1 | 3 |
| 2~ | 4 |

FIG. 29

| NUMBER OF TRANSMISSIONS | CONSTRAINT LENGTH |
|---|---|
| 2n-1 | 4 |
| 2n | 3 |

FIG. 30

| NUMBER OF TRANSMISSIONS | CONSTRAINT LENGTH |
|---|---|
| 1 | 5 |
| 2~4 | 4 |
| 5~ | 3 |

US 8,874,985 B2

COMMUNICATION SYSTEM, TRANSMISSION DEVICE, RECEPTION DEVICE, PROGRAM, AND PROCESSOR

TECHNICAL FIELD

The present invention relates to a communication system, a transmission device, a reception device, a program, and a processor.

This application claims priority to and the benefits of Japanese Patent Application No. 2010-105157 filed on Apr. 30, 2010, the disclosure of which is hereby incorporated herein by reference in its entirety.

BACKGROUND ART

In a wireless propagation path for mobile communication, a bit error is generated due to, for example, thermal noise in a reception device, resulting in deterioration of communication quality. In recent years, technology for compensating for the deterioration of the communication quality using an error correction code has been known. However, a reception device using such technology may not correctly decode data. Accordingly, performing of retransmission control (referred to as automatic retransmission control or ARQ (Automatic Repeat reQuest)) to transmit the same data again when a reception device cannot correctly decode data is known.

Retransmission controls include non-adaptive ARQ and adaptive ARQ. In the non-adaptive ARQ, the same transmission scheme is used for retransmission data and initial transmission data. For example, in technology with non-adaptive ARQ, a chase combining method is used. Technology described in Patent Literature 1 is known as technology with adaptive ARQ.

Meanwhile, turbo codes capable of achieving a characteristic close to a Shannon limit are known as error correction codes (see Non-Patent Literature 1). In the turbo codes, recursive systematic convolutional (RSC) codes of a plurality of component encoders are connected in parallel.

In recent communication technology, a turbo equalizer in which an iterative decoding scheme based on a turbo principle used in a turbo code decoding process is applied to a MAP (Maximum A Posteriori Probability) detector and a decoding unit is known. As such technology, technology described in Patent Literature 2 is known.

CITATION LIST

Patent Literature

Patent Literature 1: Japanese Patent Application Laid-Open Publication No. 2007-214824
Patent Literature 2: Japanese Patent Application Laid-Open Publication No. 2006-325063

Non-Patent Literature

Non-Patent Literature 1: C. Berrou, A. Glavieux, and P. Thitimajshima, "Near Shannon limit error-correcting coding and decoding: Turbo-codes," in Proc. ICC '93, Geneva, Switzerland, May 1993, pp. 1064-1070

SUMMARY OF INVENTION

Technical Problem

However, in the technology described in Patent Literature 2, for example, an iteration process in turbo equalization is not converged when retransmission control has been applied. Thus, in the technology described in Patent Literature 2, communication quality is deteriorated.

The present invention has been made in view of the circumstances described above, and provides a communication system, a transmission device, a reception device, a program, and a processor that are capable of improving communication quality.

Solution to Problem (1) The present invention has been made to achieve the above object, and the present invention is a communication system characterized in that the communication system includes a transmission device for coding bits with a different constraint length from a constraint length used in a past transmission to generate a retransmission signal and transmitting the generated retransmission signal and a reception device for performing turbo equalization using bits decoded with the different constraint length from the constraint length used in a past reception, the bits being bits of the retransmission signal.

(2) Further, the present invention is characterized in that, in the communication system according to claim 1, wherein the past transmission is an initial transmission.

(3) Further, the present invention is characterized in that, in the communication system, the transmission device includes a turbo coding unit for coding bits with the different constraint length from the constraint length used in the past transmission, and the reception device includes a decoding unit for decoding bits with the different constraint length from the constraint length used in the past reception.

(4) Further, the present invention is characterized in that, in the communication system, the turbo coding unit includes a first coding unit for coding bits and a second coding unit for coding bits with the different constraint length from the constraint length in the first coding unit, wherein bits of a signal in the past transmission are coded using the first coding unit, and bits of the retransmission signal are coded using the second coding unit.

(5) Further, the present invention is characterized in that, in the communication system, the decoding unit includes a first decoding unit for decoding bits a second decoding unit for decoding bits with the different constraint length from the constraint length in the first decoding unit and a decoding control unit for outputting bits of a signal in the past reception to the first decoding unit and outputting bits of the retransmission signal to the second decoding unit.

(6) Further, the present invention is characterized in that, in the communication system, the decoding unit includes a first decoding unit for decoding bits and a second decoding unit for decoding bits with the different constraint length from the constraint length in the first decoding unit, wherein the first decoding unit and the second decoding unit are connected in series.

(7) Further, the present invention is characterized in that, in the communication system, the transmission device sorts a bit sequence by a different sorting from a sorting used in the past transmission and codes the sorted bit sequence, and the reception device sorts a bit sequence by a different sorting from a sorting used in the past reception and decodes the sorted bit sequence.

(8) Further, the present invention is characterized in that, in the communication system, the transmission device includes a first coding unit for coding bits and a second coding unit for coding bits with the different constraint length from the constraint length in the first coding unit, wherein bits of a signal in the past transmission are coded using the first coding unit, and bits obtained by sorting a bit sequence by a different sorting from a sorting used in the past transmission, which are bits of the retransmission signal, are coded using the second coding unit.

(9) Further, the present invention is characterized in that, in the communication system, the reception device includes a first decoding unit for decoding bits; and a second decoding unit for decoding bits with the different constraint length from the constraint length in the first decoding unit, wherein bits of a signal in the past reception are decoded using the first decoding unit, and bits obtained by sorting a bit sequence by a different sorting from a sorting used in the past reception, which are bits of the retransmission signal, are decoded using the second coding unit.

(10) Further, the present invention is characterized in that, in the communication system, the reception device includes a first decoding unit for decoding bits a second decoding unit for decoding bits with the different constraint length from the constraint length in the first decoding unit; and a third decoding unit for decoding bits, wherein bits decoded by the first decoding unit are decoded using the second decoding unit and the third decoding unit, and decoding in the first decoding unit is performed using the decoded bits.

(11) Further, the present invention is characterized in that, in the communication system, the constraint length used for the retransmission signal is shorter than the constraint length used in the past transmission.

(12) Further, the present invention is characterized in that, in the communication system, the constraint length used for the retransmission signal is determined based on information indicating convergence of a turbo code, and the information indicating convergence of the turbo code is any one of the number of retransmissions; the number of retransmissions and a coding rate; the number of reception antennas of the reception device; a modulation level; an overlapping bandwidth; and a bandwidth to be clipped.

(13) Further, the present invention is a transmission device for coding bits with a different constraint length from a constraint length used in a past transmission to generate a retransmission signal and transmitting the generated retransmission signal.

(14) Further, the present invention is a reception device for performing turbo equalization using bits decoded with a different constraint length from a constraint length used in a past reception, the bits being bits of a retransmission signal.

(15) Further, the present invention is a program for causing a computer of a transmission device to execute a procedure of coding bits with a different constraint length from a constraint length used in a past transmission to generate a retransmission signal.

(16) Further, the present invention is a program for causing a computer of a reception device to execute a procedure of performing turbo equalization using bits decoded with a different constraint length from a constraint length used in a past reception, the bits being bits of a retransmission signal.

(17) Further, the present invention is a processor for coding bits of a retransmission signal with a different constraint length from a constraint length used in a past transmission.

(18) Further, the present invention is a processor for decoding bits of a retransmission signal with a different constraint length from a constraint length used in a past reception.

Advantageous Effects of Invention

According to the present invention, it is possible to improve communication quality.

BRIEF DESCRIPTION OF DRAWINGS

FIG. 9 is a schematic diagram illustrating an example of a constraint length table according to variant 1.

FIG. 10 is a schematic diagram illustrating an example of a constraint length table according to variant 2.

FIG. 24 is a schematic diagram illustrating an example of a constraint length table according to variant 7.

FIG. 28 is a schematic diagram illustrating an example of a constraint length table according to variant 9.

FIG. 29 is a schematic diagram illustrating an example of a constraint length table according to variant 10.

FIG. 30 is a schematic diagram illustrating an example of a constraint length table according to variant 11.

DESCRIPTION OF EMBODIMENTS

Hereinafter, embodiments of the present invention will be described in detail with reference to the drawings.

Figure 1:
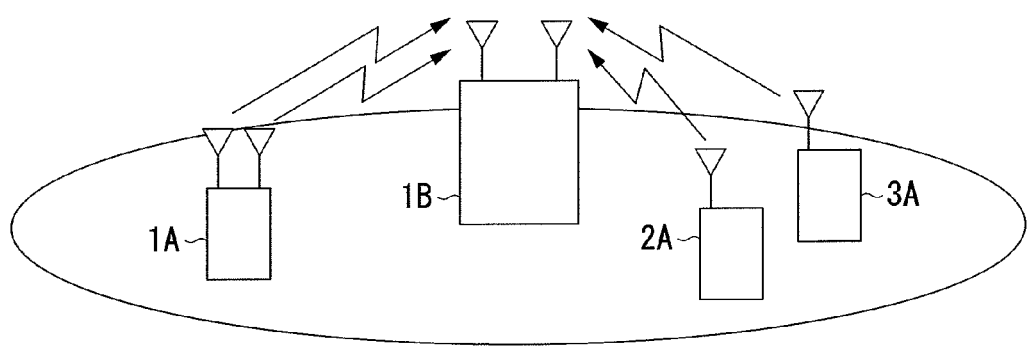
FIG. 1 is a conceptual diagram of a communication system in each embodiment.

FIG. 1 is a conceptual diagram of a communication system in each embodiment. In FIG. 1, each of mobile station devices (User Equipment) 1A to 3A includes a transmission device to transmit a signal. A base station device (eNodeB) 1B includes a reception device to receive the signal transmitted from each of the mobile station devices 1A to 3A.

In FIG. 1, the mobile station device 1A includes a plurality of antennas to perform data transmission such as MIMO (Multiple Input Multiple Output) transmission or transmission diversity. Meanwhile, each of the mobile station devices 2A and 3A includes one antenna to perform data transmission. Further, the number of the antennas of the mobile station devices 1A to 3A and the base station device 1B may be arbitrary. For example, in the communication system, the mobile station devices 2A and 3A may include a plurality of antennas to perform data transmission based on single user MIMO or perform multi-user MIMO in which a plurality of mobile stations perform data transmission using the same time and the same frequency, and the base station device 1B may receive signals of multi-users using one antenna and may eliminate interference using turbo equalization.

(First Embodiment)

Hereinafter, in the present embodiment, the mobile station devices 2A and 3A of FIG. 1 are referred to as a mobile station device 1a and the base station device 1B is referred to as a base station device 1b.

<Mobile Station Device 1a>

Figure 2:
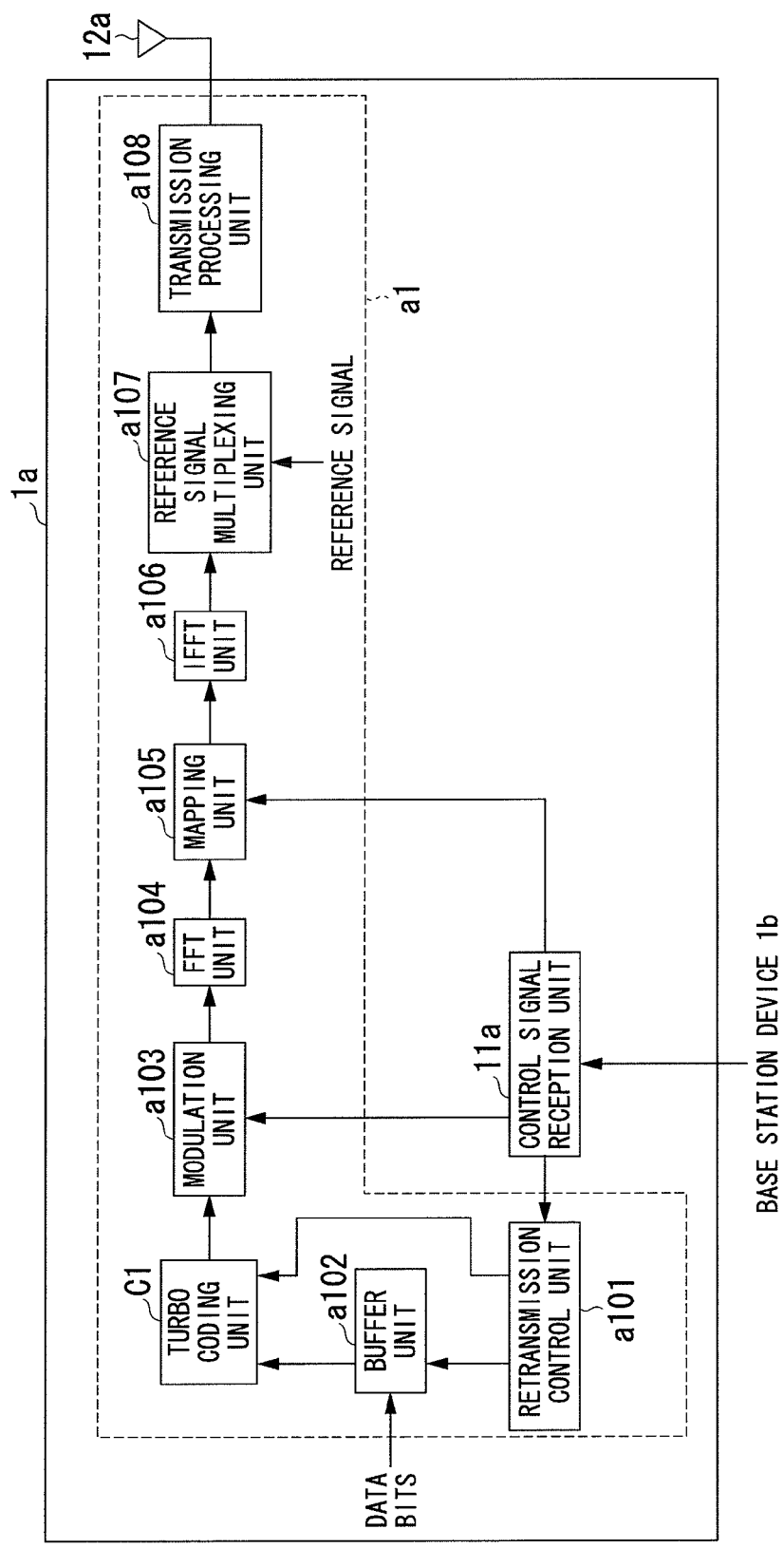
FIG. 2 is a schematic block diagram illustrating a configuration of a mobile station device according to a first embodiment of the present invention.

FIG. 2 is a schematic block diagram illustrating a configuration of the mobile station device 1a according to the first embodiment of the present invention. In FIG. 2, the mobile station device 1a includes a control signal reception unit 11a, a transmission device a1, and a transmission antenna 12a. The transmission device a1 includes a retransmission control unit a101, a buffer unit a102, a turbo coding unit C1, a modulation unit a103, an FFT (Fast Fourier Transform) unit a104, a mapping unit a105, an IFFT (Inverse Fast Fourier Transform) unit a106, a reference signal multiplexing unit a107, and a transmission processing unit a108.

The control signal reception unit 11a receives control information notified from the base station device 1b. Band allocation information used for data transmission, modulation scheme information, and coding information (a coding rate (or a puncture pattern) and a constraint length) are contained in the control information. However, the control information may contain some of the information or may contain other information.

When data transmission is performed in a past frame, the control signal reception unit 11a receives a transmission acknowledgement signal indicating whether a reception device of the base station device 1b has received data correctly. The transmission acknowledgement signal includes an ACK (ACKnowlegement) signal or a NACK (Negative ACKnowledgement). ACK is a signal notified from the base station device 1b to the mobile station device 1a when the reception device has received data correctly. On the other hand, NACK is a signal notified from the base station device 1b to the mobile station device 1a when the reception device is unable to receive data correctly, and is a retransmission request signal indicating that retransmission of data to the base station device 1b is required. Further, control information for a retransmission signal (referred to as retransmission control information) is contained in the transmission acknowledgement signal.

The control signal reception unit 11a extracts modulation scheme information and band allocation information from the control information and the retransmission control information that have been received, and outputs the modulation scheme information and the band allocation information to the modulation unit a103 and the mapping unit a105. Further, the control signal reception unit 11a outputs coding information and the transmission acknowledgement signal extracted from the control information and the retransmission control information to the retransmission control unit 110.

The retransmission control unit a101 determines whether the transmission acknowledgement signal input from the control signal reception unit 11a is ACK or NACK. If the transmission acknowledgement signal is determined to be ACK, the retransmission control unit a101 outputs an initial transmission data input instruction to the buffer unit a102. Further, in this case, the retransmission control unit a101 outputs the coding information input from the control signal reception unit 11a to the turbo coding unit C1.

On the other hand, if the transmission acknowledgement signal is determined to be NACK, the retransmission control unit a101 outputs a retransmission data input instruction to the buffer unit a102. Further, in this case, the retransmission control unit a101 outputs coding information of the retransmission control information input from the control signal reception unit 11a to the turbo coding unit C1.

The buffer unit a102 stores input data bits. When the buffer unit a102 receives the initial transmission data input instruction from the retransmission control unit a101, the buffer unit a102 outputs a data bit sequence (referred to as an initial transmission data bit sequence) next to a transmitted data bit sequence in a past frame, to the turbo coding unit C1. On the other hand, when the buffer unit a102 receives the retransmission data input instruction from the retransmission control unit a101, the buffer unit a102 outputs the same data bit sequence (referred to as a retransmission data bit sequence) as the transmitted data bit sequence in a past frame to the turbo coding unit C1.

The turbo coding unit C1 turbo-codes the bit sequence input from the buffer unit a102 based on the coding information input from the retransmission control unit a101 to generate coded bits. A bit for cyclic redundancy check (CRC) is added to the coded bits. The turbo coding unit C1 outputs the generated coded bits to the modulation unit a103. Further, details of the turbo coding unit C1 will be described below.

The modulation unit a103 modulates the coded bits input from the turbo coding unit C1 using a modulation scheme indicated by the modulation scheme information input from the control signal reception unit 11a to generate a modulated symbol. Here, the modulation scheme includes, for example, QPSK (Quaternary Phase Shift Keying) and 16QAM (16-ary Quadrature Amplitude Modulation). The modulation unit a103 outputs the generated modulated symbol to the FFT unit a104.

The FFT unit a104 converts the modulated symbols input from the modulation unit a103, which are in a time domain, to signals in a frequency domain and outputs the signals in the frequency domain to the mapping unit a105.

The mapping unit a105 arranges (maps) the signal input from the FFT unit a104 in each band, based on the band allocation information input from the control signal reception unit 11a, and outputs the resultant signal to the IFFT unit a106.

The IFFT unit a106 converts the signals from the mapping unit a105 which are in the frequency domain, into signals in the time domain, and outputs the signals in the time domain to the reference signal multiplexing unit a107.

The reference signal multiplexing unit a107 multiplexes, in the time domain, a reference signal whose waveform is stored in the transmission device a1 of the mobile station device 1a and the reception device b1 of the base station device 1b in advance with the signal input from the IFFT unit a106. Further, the transmission device a1, for example, may multiplex, in the frequency domain, the reference signal with the signal before the IFFT unit a106 processes the signal. The reference signal multiplexing unit a107 outputs the multiplexed signal to the transmission processing unit a108.

The transmission processing unit a108 inserts a CP (Cyclic Prefix) into the signal input from the reference signal multiplexing unit a107. The transmission processing unit a108 performs D/A (Digital/Analog)-conversion on a signal after CP insertion, and performs up-conversion to a radio frequency. The transmission processing unit a108 amplifies a signal after up-conversion to a transmission power using a PA (Power Amplifier) and transmits a resultant signal via the transmission antenna 12a.

<Turbo Coding Unit C1>

Figure 3:
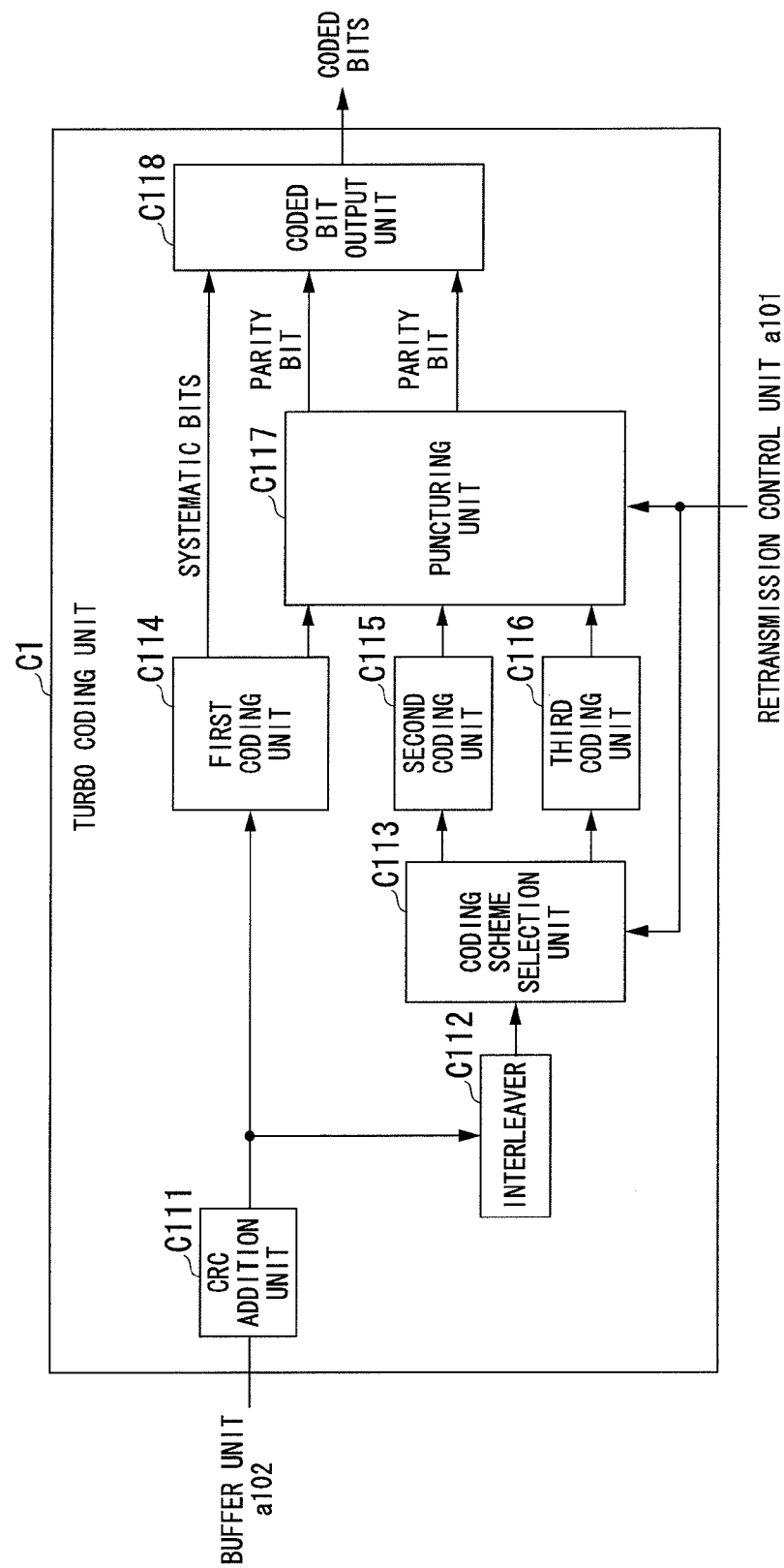
FIG. 3 is a schematic block diagram illustrating a configuration of a turbo coding unit according to the present embodiment.

FIG. 3 is a schematic block diagram illustrating a configuration of the turbo coding unit C1 according to the present embodiment. The turbo coding unit C1 includes a CRC addition unit C111, an interleaver C112, a coding scheme selection unit C113, a first coding unit C114, a second coding unit C115, a third coding unit C116, a puncturing unit C117, and coded bit output unit C118.

Here, the first coding unit C114 and the second coding unit C115 perform coding in which a constraint length is "4." On the other hand, the third coding unit C116 performs coding in which the constraint length is "3." Further, the constraint length of the third coding unit C116 may be different from the constraint lengths of the other coding units, and is not limited to such a value of the constraint length. Further, the turbo coding unit C1 may include a coding unit having a different constraint length from the other coding units, in addition to the above configuration.

The CRC addition unit C111 receives the bit sequence (the initial transmission data bit sequence or the retransmission data bit sequence) from the buffer unit a102. The CRC addition unit C111 adds a bit for cyclic redundancy check to the input bit sequence and outputs a resultant bit sequence to the interleaver C112 and the first coding unit C114.

The interleaver C112 sorts (interleaves) the bit sequence input from the CRC addition unit C111 in a predetermined order, and outputs a resultant bit sequence to the coding scheme selection unit C113.

The coding scheme selection unit C113 outputs the bit sequence input from the interleaver C112 to the coding unit corresponding to a constraint length indicated by the coding information input from the retransmission control unit a101. Specifically, when the constraint length indicated by the coding information is "3," the coding scheme selection unit C113 outputs the bit sequence to the third coding unit C116. On the other hand, when the constraint length indicated by the coding information is "4," the coding scheme selection unit C113 outputs the bit sequence to the second coding unit C115.

The first coding unit C114 outputs systematic bits that are the input bit sequence to the coded bit output unit C118. Further, the first coding unit C114 codes the bits input from the CRC addition unit C111 using an RSC (recursive systematic convolutional) code whose constraint length is "4." The first coding unit C114 outputs parity bits generated by coding to the puncturing unit C117.

The second coding unit C115 codes the bits input from the coding scheme selection unit C113 using an RSC code whose constraint length is "4." The second coding unit C115 outputs parity bits generated by coding to the puncturing unit C117.

The third coding unit C116 codes the bits input from the coding scheme selection unit C113 using an RSC code whose constraint length is "3." The third coding unit C116 outputs parity bits generated by coding to the puncturing unit C117.

The puncturing unit C117 stores puncture information in which a coding rate is associated with a puncture pattern in advance. The puncturing unit C117 selects a puncture pattern from the puncture information based on the coding rate indicated by the coding information input from the retransmission control unit a101. The puncturing unit C117 punctures the parity bits input from the first coding unit C114 and the second coding unit C115 or the third coding unit C116 using the selected puncture pattern. The puncturing unit C117 outputs the punctured parity bits to the coded bit output unit C118.

The coded bit output unit C118 connects the systematic bits input from the first coding unit C114 with the parity bits input from the puncturing unit C117 in a predetermined connection order to generate coded bits. Specifically, the coded bit output unit C118 connects the systematic bits with the parity bits in order of the systematic bits (referred to as a bit sequence B11), a parity bit part (referred to as a bit sequence B12) of the first coding unit C114, and a parity bit part (a bit sequence B13) of the second coding unit C115 or the third coding unit C116. The coded bit output unit C118 outputs the generated coded bits.

As will be described below, in the control information used for initial transmission, the constraint length indicated by the coding information is "4." On the other hand, in the retransmission control information, the constraint length indicated by the coding information is "3." In this case, according to the configuration of the turbo coding unit C1, an initial transmission data bit sequence output via the CRC addition unit C111, the interleaver C112, and the coding scheme selection unit C113 is coded by the second coding unit C115 (the constraint length "4") and punctured by the puncturing unit C117. On the other hand, the retransmission data bit sequence output via the CRC addition unit C111, the interleaver C112, and the coding scheme selection unit C113 is coded by the third coding unit C116 (the constraint length "3") and punctured by the puncturing unit C117.

In other words, the turbo coding unit C1 codes bits to generate the retransmission signal using both the constraint length "3" (the coding unit C116), which is different from the constraint length "4" (the coding units C114 and C115) used for the initial transmission, and the constraint length "4" (the coding unit 117).

Figure 4:
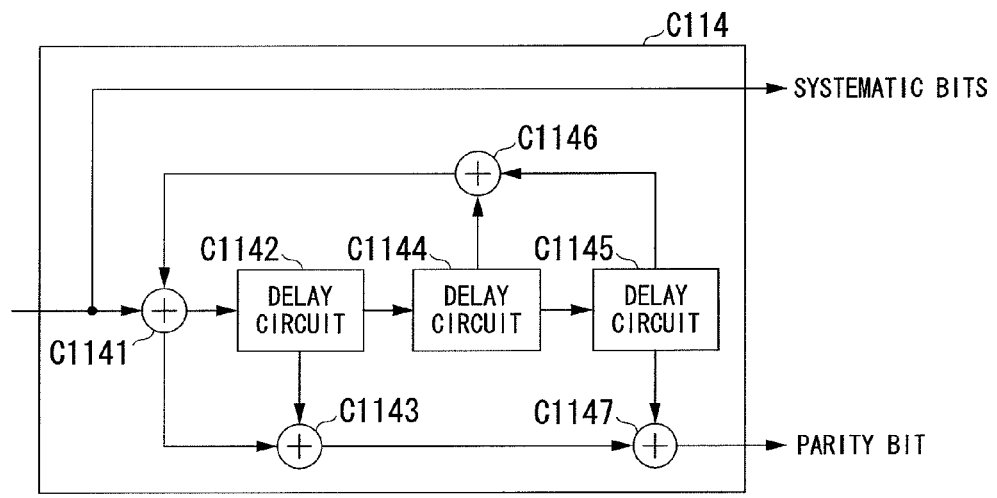
FIG. 4 is a schematic diagram illustrating a configuration of a first coding unit according to the present embodiment.

FIG. 4 is a schematic diagram illustrating a configuration of the first coding unit C114 according to the present embodiment. In FIG. 4, the first coding unit C114 includes addition units C1141, C1143, C1146, and C1147, and delay circuits C1142, C1144 and C1145. The addition units C1141, C1143, C1146, and C1147 add input bits. Here, the addition process is the same operation as an exclusive logic since an output consists of 1 bit and an output bit is "0" when the input bits are "1" and "1." The delay circuits C1142, C1144 and C1145 delay an input bit by 1 bit and output a resultant bit. Further, a configuration of the second coding unit C115 is the same as that of the first coding unit C114 except that there is no output of systematic bits.

Figure 5:
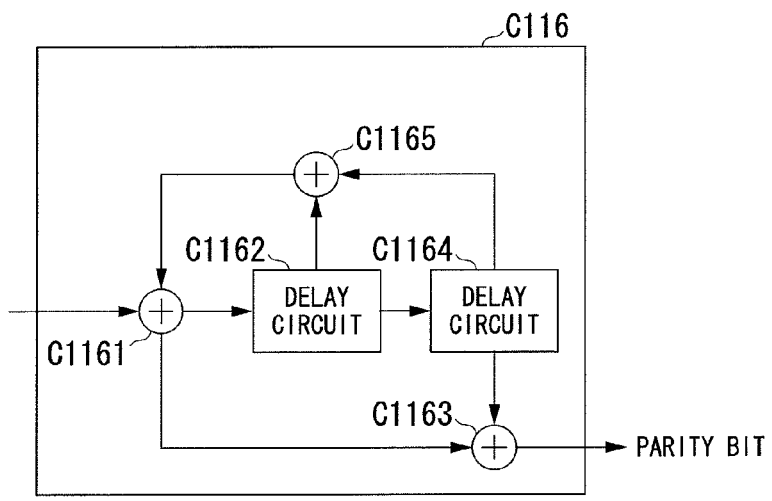
FIG. 5 is a schematic diagram illustrating a configuration of a third coding unit according to the present embodiment.

FIG. 5 is a schematic diagram illustrating a configuration of the third coding unit C116 according to the present embodiment. In FIG. 5, the third coding unit C116 includes addition units C1161, C1163, and C1165 and delay circuits C1162 and C1164. The addition units C1161, C1163, and C1165 add input bits. The delay circuits C1162 and C1164 delay an input bit by 1 bit and output a resultant bit.

<Base Station Device 1b>

Figure 6:
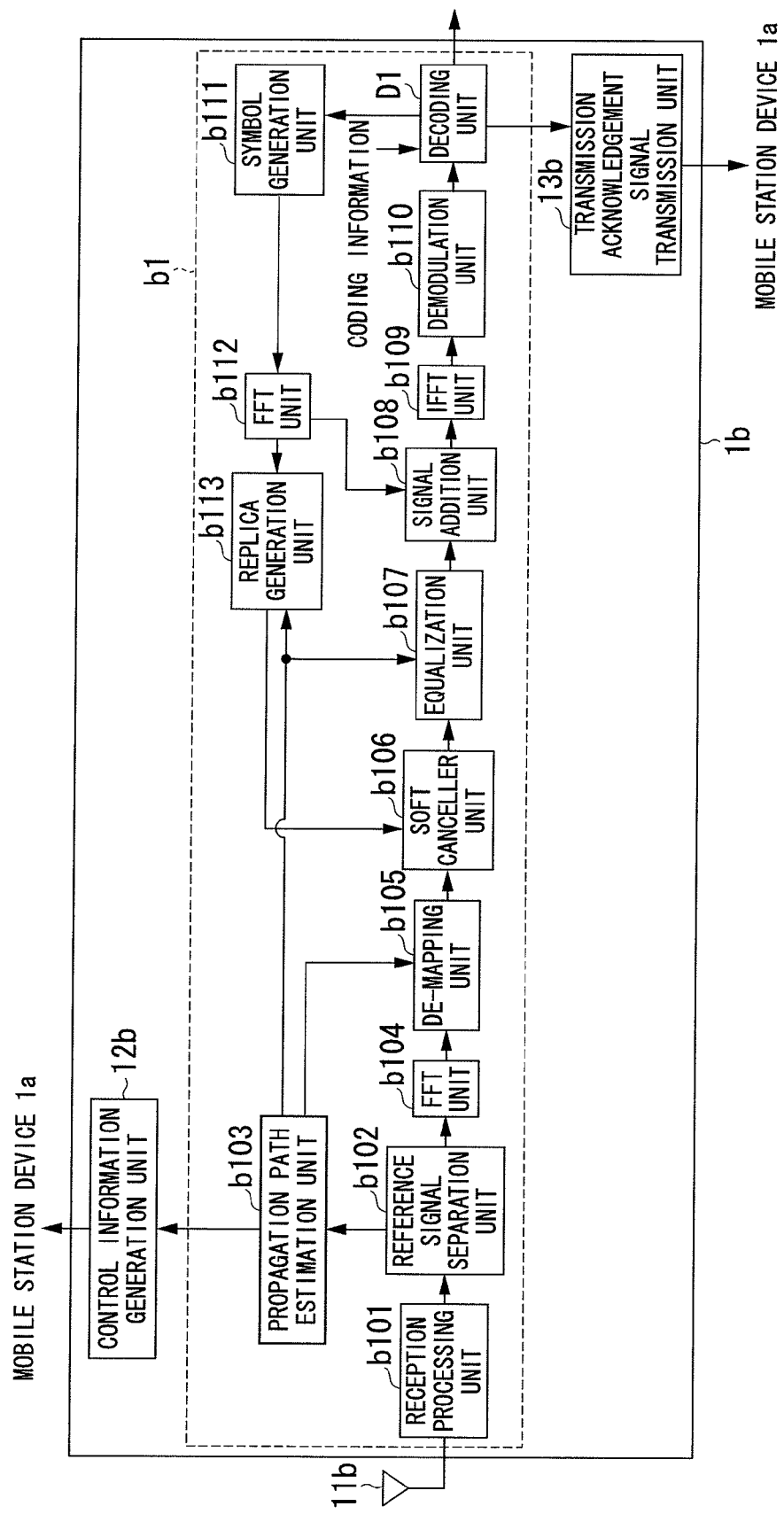
FIG. 6 is a schematic block diagram illustrating a configuration of a base station device according to the present embodiment.

FIG. 6 is a schematic block diagram illustrating a configuration of the base station device 1b according to the present embodiment.

In FIG. 6, the base station device 1b includes a reception antenna 11b, a reception device b1, a control information generation unit 12b, and a transmission acknowledgement signal transmission unit 13b. The reception device b1 includes a reception processing unit b101, a reference signal separation unit b102, a propagation path estimation unit b103, an FFT unit b104, a de-mapping unit b105, a soft canceller unit b106, an equalization unit b107, a signal addition unit b108, an IFFT unit b109, a demodulation unit b110, a decoding unit D1, a symbol generation unit b111, an FFT unit b112, and a replica generation unit b113.

The reception processing unit b101 receives the signal transmitted from the mobile station device 1a via the reception antenna 11b. The reception processing unit b101 down-converts the received signal to a baseband frequency and performs A/D (Analog/Digital) on the signal. The reception processing unit b101 removes the CP from a signal after the A/D conversion, and output a resultant signal to the reference signal separation unit b102.

The reference signal separation unit b102 separates the signal input from reception processing unit b101 into a reference signal and a signal other than the reference signal. The reference signal separation unit b102 outputs the separated reference signal to the propagation path estimation unit b103 and outputs the signal other than the reference signal to the FFT unit b104.

The propagation path estimation unit b103 estimates a frequency response of a propagation path (referred to as a propagation path characteristic) based on the reference signal input from the reference signal separation unit b102 and the reference signal stored in advance. The propagation path estimation unit b103 outputs propagation path characteristic information indicating the estimated propagation path characteristic to the control information generation unit 12b, the equalization unit b107, and the replica generation unit b113.

The control information generation unit 12b determines allocation of a band to each mobile station device 1a, a modulation scheme, a coding rate (or a puncture pattern), and a constraint length based on the propagation path characteristic indicated by the information input from the propagation path estimation unit b103. The control information generation unit 12b generates band allocation information indicating the determined band allocation, modulation scheme information indicating the modulation scheme, the coding rate (or the puncture pattern) and coding information indicating the constraint length. The control information generation unit 12b notifies the mobile station device 1a of control information containing the band allocation information, the modulation scheme information, and the coding information that are generated.

The control information generation unit 12b outputs the generated band allocation information to the de-mapping unit b105. The control information generation unit 12b outputs the generated modulation scheme information to the demodulation unit b110 and the symbol generation unit b111. The control information generation unit 12b outputs the generated coding information to the decoding unit D1.

The FFT unit b104 converts the signals input from the reference signal separation unit b102 from the time domain to the frequency domain, and outputs resultant signals to the de-mapping unit b105.

The de-mapping unit b105 extracts (de-maps) the signal input from the FFT unit b104 from each band based on the band allocation information input from the control information generation unit 12b and outputs the signal to the soft canceller unit b106. However, when the decoding unit D1 has determined band allocation information for a retransmission signal, the de-mapping unit b105 performs de-mapping based on the band allocation information.

The soft canceller unit b106 receives a replica signal (soft replica) of a desired signal generated from the decoded data bit (which is fed back) from the replica generation unit b113. The soft canceller unit b106 stores the signal input from the de-mapping unit b105 and subtracts the input soft replica from the stored signal. The soft canceller unit b106 outputs the signal after the subtraction to the equalization unit b107.

Further, in an initial process for a certain signal, since there is no input of the soft replica, the signal input from the de-mapping unit b105 is directly output to the equalization unit b107.

The equalization unit b107 performs an equalization process on the signal input from the soft canceller unit b106 based on the propagation path characteristic information input from the propagation path estimation unit b103. This equalization process is a process of multiplying a weight based on an MMSE (Minimum Mean Square Error) criterion or a ZF (Zero Forcing) weight to compensate for distortion due to a wireless propagation path. The equalization unit b107 outputs a signal after the equalization process to the signal addition unit b108.

The signal addition unit b108 receives, from the FFT unit b112, a replica signal in a frequency domain of a symbol generated from the decoded data bit. The signal addition unit b108 adds the input replica signal to the signal input from the equalization unit b107. The signal addition unit b108 outputs a signal after the addition to the IFFT unit b109.

The IFFT unit b109 converts the signals input from the signal addition unit b108 from the frequency domain to the time domain and outputs resultant signals to the demodulation unit b110.

The demodulation unit b110 demodulates the signal input from the IFFT unit b109 based on the modulation scheme information input from the control information generation unit 12b to convert the signal into the coded bit. However, when the decoding unit D1 has determined modulation scheme information for a retransmission signal, the demodulation unit b110 demodulates the coded bit based on the modulation scheme information. The demodulation unit b110 outputs the demodulated coded bit to the decoding unit D1.

The decoding unit D1 decodes the coded bit input from the demodulation unit b110 based on the coding information input from the control information generation unit 12b. However, when the decoding unit D1 has determined coding information for the retransmission signal, the decoding unit D1 decodes coded bits of the retransmission signal based on the determined coding information.

The decoding unit D1 checks if the data bits have been acquired correctly based on the bit for cyclic redundancy check contained in the decoded bit sequence. The decoding unit D1 determines retransmission control information based on a check result after feedback to the soft canceller any number of times. The decoding unit D1 outputs the data bits except for the bit for cyclic redundancy check and the retransmission control information to an external device. Further, when a result of error correction decoding of the coded bits in the decoding unit D1 is erroneous, bits obtained by puncturing the decoded bits again are output to the symbol generation unit b111. Further, the decoding unit D1 outputs a transmission instruction to transmit the transmission acknowledgement signal and the retransmission control information to the transmission acknowledgement signal transmission unit 13b based on a check result after feedback to the soft canceller any number of times or a predetermined number of times. Further, details of the decoding unit D1 will be described below.

The symbol generation unit b111 performs the same process (modulation) as the modulation unit a103 of the mobile station device 1a based on the modulation scheme information input from the control information generation unit 12b to generate a symbol replica. However, when the decoding unit D1 has determined modulation scheme information for the retransmission signal, the symbol generation unit b111 performs modulation based on the modulation scheme information. The symbol generation unit b111 outputs the generated symbol replica to the FFT unit b112.

The FFT unit b112 converts the symbol replicas input from the symbol generation unit b111, which are in a time domain, into signals (replica signals) in a frequency domain, and outputs the signals to the replica generation unit b113 and the signals addition unit b108.

The replica generation unit b113 multiplexes the replica signal input from the FFT unit b112 by the propagation path characteristic information input from the propagation path estimation unit b103 to generate soft replica. The replica generation unit b113 outputs the generated soft replica to the soft canceller unit b106.

The transmission acknowledgement signal transmission unit 13b notifies the mobile station device 1a of ACK or NACK as the transmission acknowledgement signal in response to the transmission instruction input from the decoding unit D1. Here, when the transmission acknowledgement signal transmission unit 13b notifies of NACK, the transmission acknowledgement signal transmission unit 13b notifies of a transmission acknowledgement signal containing the retransmission control information input from the decoding unit D1. Further, the transmission acknowledgement signal transmission unit 13b may simultaneously notify of NACK and the retransmission control information or may separately notify of NACK and the retransmission control information at different timings.

Further, while the example in which, in the turbo equalization of the base station device 1b of the present embodiment, a soft canceller and an equalizer in a single carrier are used as a MAP detector and inter-symbol interference is cancelled by performing a reception process for an iteration process of the MAP detector and the decoder has been described, the configuration of the turbo equalization is not limited to the present example. For example, it may be applied to a case in which a MAP detector in a multi-carrier is used as the soft canceller, and inter-symbol interference or inter-carrier interference is cancelled through a reception process iterative turbo equalization of the MAP detector and the decoder.

<Decoding Unit D1>

Figure 7:
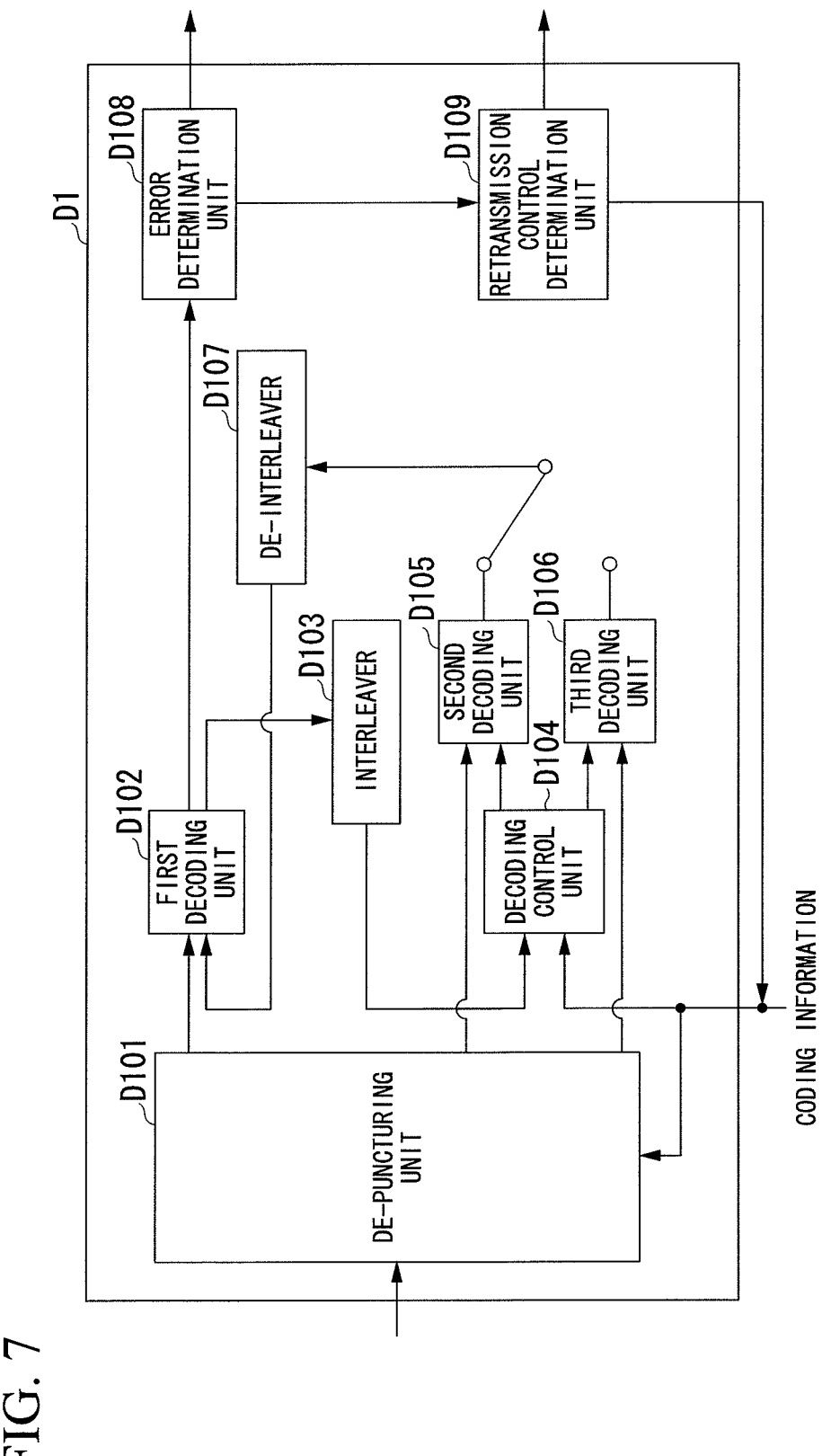
FIG. 7 is a schematic block diagram illustrating a configuration of a decoding unit according to the present embodiment.

FIG. 7 is a schematic block diagram illustrating a configuration of the decoding unit D1 according to the present embodiment. In FIG. 7, the decoding unit D1 includes a de-puncturing unit D101, a first decoding unit D102, an interleaver D103, a decoding control unit D104, a second decoding unit D105, a third decoding unit D106, a de-interleaver D107, an error determination unit D108, and a retransmission control determination unit D109.

Here, the de-puncturing unit D101 and the decoding control unit D104 receive coding information from the control information generation unit 12b and the retransmission control determination unit D109. The de-puncturing unit D101 and the decoding control unit D104 select the coding information from the retransmission control determination unit D109 when performing a process for a retransmission signal and the coding information from control information generation unit 12b in other cases, and perform the process.

The de-puncturing unit D101 separates the coded bits input from the demodulation unit b110 according to the same connection order as that used by the coded bit output unit C118 of the turbo coding unit C1. Specifically, the de-puncturing unit D101 separates the coded bits into the bit sequences B11, B12 and B13.

The de-puncturing unit D101 stores the same puncture pattern information as that stored in the puncturing unit C117. The de-puncturing unit D101 selects the puncture pattern from the puncture information based on the selected coding information. The de-puncturing unit D101 inserts (de-punctures) a bit indicating "0" into a part punctured with the selected puncture pattern for the separated bit sequences B12 and B13.

The de-puncturing unit D101 outputs the separated bit sequence B11 (referred to as a systematic bit 11) and de-punctured bit sequence B12 (referred to as a parity bit 21) to the first decoding unit D102. Further, the de-puncturing unit D101 outputs the de-punctured bit sequence B13 (referred to as a parity bit 22) to the decoding unit corresponding to the constraint length indicated by the selected coding information. Specifically, when the constraint length indicated by the coding information is "3," the de-puncturing unit D101 outputs the parity bit 22 to the third decoding unit D106. On the other hand, when the constraint length indicated by the coding information is "4," the de-puncturing unit D101 outputs the parity bit 22 to the second decoding unit D105.

The first decoding unit D102 stores the parity bit 1 input from the de-puncturing unit D101. The first decoding unit D102 performs a decoding process based on MAP (Maximum A Posteriori probability) estimation using the stored parity bit 21 and the bit sequence (the systematic bit 12) input from the de-interleaver D107. Accordingly, the first decoding unit D102 performs an error correction process on a desired data bit (referred to as a systematic bit 13). However, in an initial process, the first decoding unit D102 performs a decoding process based on the MAP estimation using the stored parity bit 21 and the systematic bit 11.

The first decoding unit D102 outputs the decoded systematic bit 13 to the error determination unit D108 when the decoding process is performed a predetermined number of times and outputs the decoded systematic bit 13 to the interleaver D103 when the decoding process is not performed a predetermined number of times.

The interleaver D103 sorts (interleaves) the systematic bit 13 input from the first decoding unit D102 in a predetermined order, and outputs the sorted systematic bit to the decoding control unit D104 (the bit sequence after the sorting is referred to as a systematic bit 14). Here, the predetermined order is the same as the order used by the interleaver C112 of the turbo coding unit C1.

The decoding control unit D104 outputs the systematic bit 14 input from the interleaver D103 to the selected decoding unit corresponding to the constraint length indicated by the coding information. Specifically, when the constraint length indicated by the coding information is "3," the decoding control unit D104 outputs the systematic bit 14 to the third decoding unit D106. On the other hand, when the constraint length indicated by the coding information is "4," the decoding control unit D104 outputs the systematic bit 14 to the second decoding unit D105.

The second decoding unit D105 stores the parity bit 22 input from the de-puncturing unit D101. The second decoding unit D105 performs a decoding process based on the MAP estimation using the stored parity bit 22 and the systematic bit 14 input from the interleaver D103. Accordingly, the second decoding unit D105 performs an error correction process on the interleaved desired data bits (referred to as systematic bits 15). Here, the second decoding unit D105 performs a decoding process of the constraint length "4." The second decoding unit D105 outputs the decoded systematic bit 15 to the de-interleaver D107.

The third decoding unit D106 stores the parity bit 22 input from the de-puncturing unit D101. The third decoding unit D106 performs a decoding process based on the MAP estimation using the stored parity bit 22 and the systematic bit 14 input from the interleaver D103 to perform an error correction process on the interleaved desired data bits (referred to as systematic bits 16). Here, the third decoding unit D106 performs a decoding process of the constraint length "3." The third decoding unit D106 outputs the decoded systematic bit 16 to the de-interleaver D107.

Further, while a case in which the de-interleaver D107 is connected to the second decoding unit D105 is described in FIG. 7, a connection of the de-interleaver D107 is switched to any one of the second decoding unit D105 and the third decoding unit D106. Specifically, the de-interleaver D107 is connected to the decoding unit corresponding to the constraint length indicated by the coding information.

The de-interleaver D107 sorts the systematic bit 15 input from the second decoding unit D105 or the systematic bit 16 input from the third decoding unit D106 in a predetermined order, and outputs the sorted systematic bit to the first decoding unit D102 (the bit sequence after the sorting is referred to as a systematic bit 12). Here, the predetermined order is reverse to the order used by the interleaver C112.

According to the above configuration, the systematic bit 12 input from the de-interleaver D107 is decoded by the first decoding unit D102, interleaved by the interleaver D103, and decoded by the second decoding unit D105 or the third decoding unit D106. The decoded bit sequence is then interleaved by the de-interleaver D107 and input to the first decoding unit D102. The systematic bit 12 is repeatedly subjected to such a process a predetermined number of times and output to the error determination unit D108.

In other words, the decoding unit D1 can perform decoding through switching of the decoding unit and the de-interleaver even when the retransmission signal coded with a different constraint length from the constraint length of the coded bits received in the initial transmission is received.

The error determination unit D108 extracts a bit for cyclic redundancy check from the systematic bit 13 input from the first decoding unit D102, and checks if the data bits have been acquired correctly based on this bit.

If it is determined that the data bits have been acquired correctly (there is no error), the error determination unit D108 outputs the acquired data bits to an external device. Further, in this case, the error determination unit D108 transmits a transmission instruction indicating transmission of ACK to the transmission acknowledgement signal transmission unit 13b.

On the other hand, if it is determined that the data bits have not been acquired correctly (there is an error), the error determination unit D108 outputs the acquired data bits to the symbol generation unit b111. Further, the error determination unit D108 counts the number of times the data bits are not acquired correctly, i.e., the number of times the equalization process has been performed (referred to as the number of equalizations). If it is determined that the data have not been acquired correctly when the number of equalizations exceeds a predetermined value, the error determination unit D108 outputs information indicating that a retransmission is required to the retransmission control determination unit D109.

When the information indicating that a retransmission is required is input, the retransmission control determination unit D109 determines the constraint length to be "3." This constraint length is shorter than the constraint length "4" of the initial transmission. In this case, the communication system performs, in retransmission, coding and decoding with a shorter constraint length than the constraint length of the initial transmission (past transmission) in which the data bits were not received correctly.

The retransmission control determination unit D109 generates retransmission control information containing the coding information indicating the determined constraint length. The retransmission control determination unit D109 outputs the generated retransmission control information and a transmission instruction to transmit NACK to the transmission acknowledgement signal transmission unit 13b. Further, the retransmission control determination unit D110 outputs the coding information contained in the generated retransmission control information to the de-puncturing unit D101 and the decoding control unit D104. Further, the retransmission control determination unit D109 may determine band allocation information, modulation scheme information, and coding information indicating a coding rate (or a puncture pattern) based on the propagation path characteristic information. If the information is determined, the retransmission control determination unit D109 generates retransmission control information containing such information. Further, while the example in which the error determination unit D108 receives the bits output from the first decoding unit D102 after turbo decoding is iteratively performed any number of times or a predetermined number of times has been described, the error determination unit D108 may receive the output from the second decoding unit D105 or the third decoding unit D106.

Figure 31:
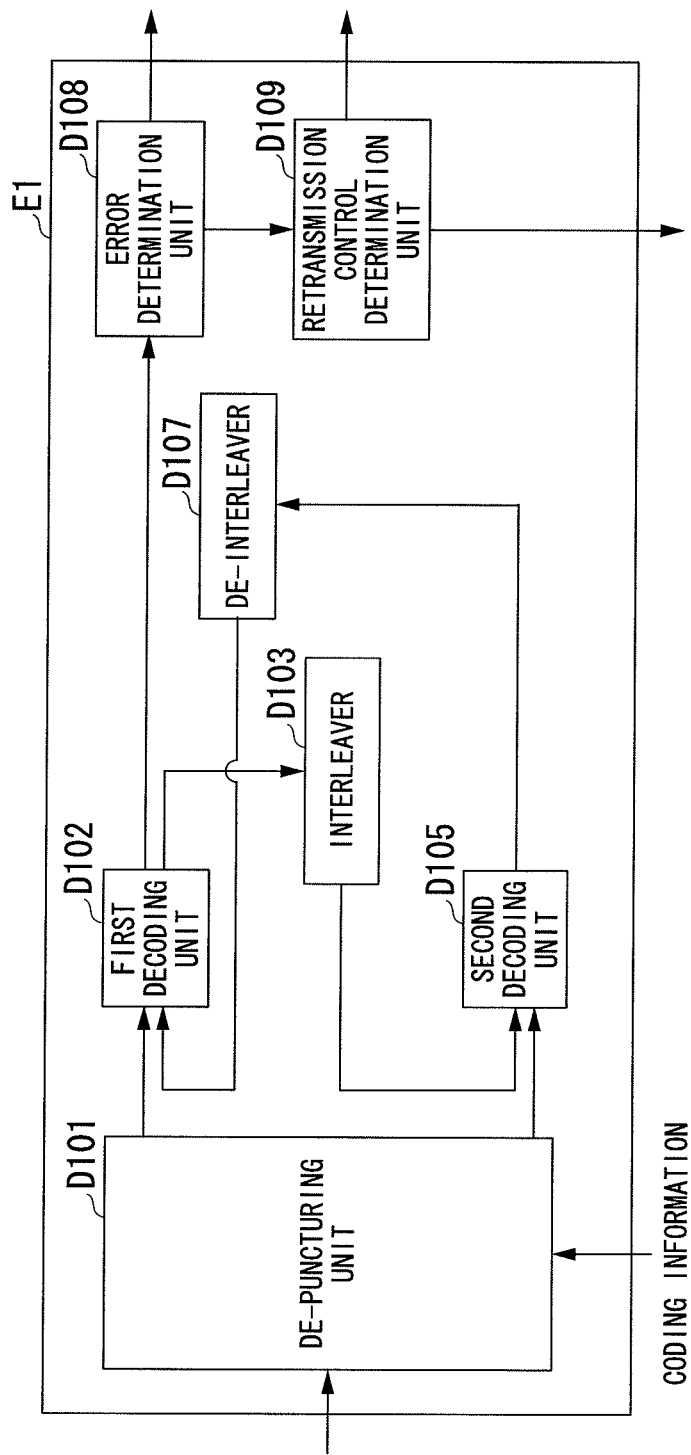
FIG. 31 is a schematic block diagram illustrating a configuration of a decoding unit according to related art.

Further, FIG. 31 is a schematic block diagram illustrating a configuration of a decoding unit E1 according to related art.
<Operation of Communication System>

Figure 8:
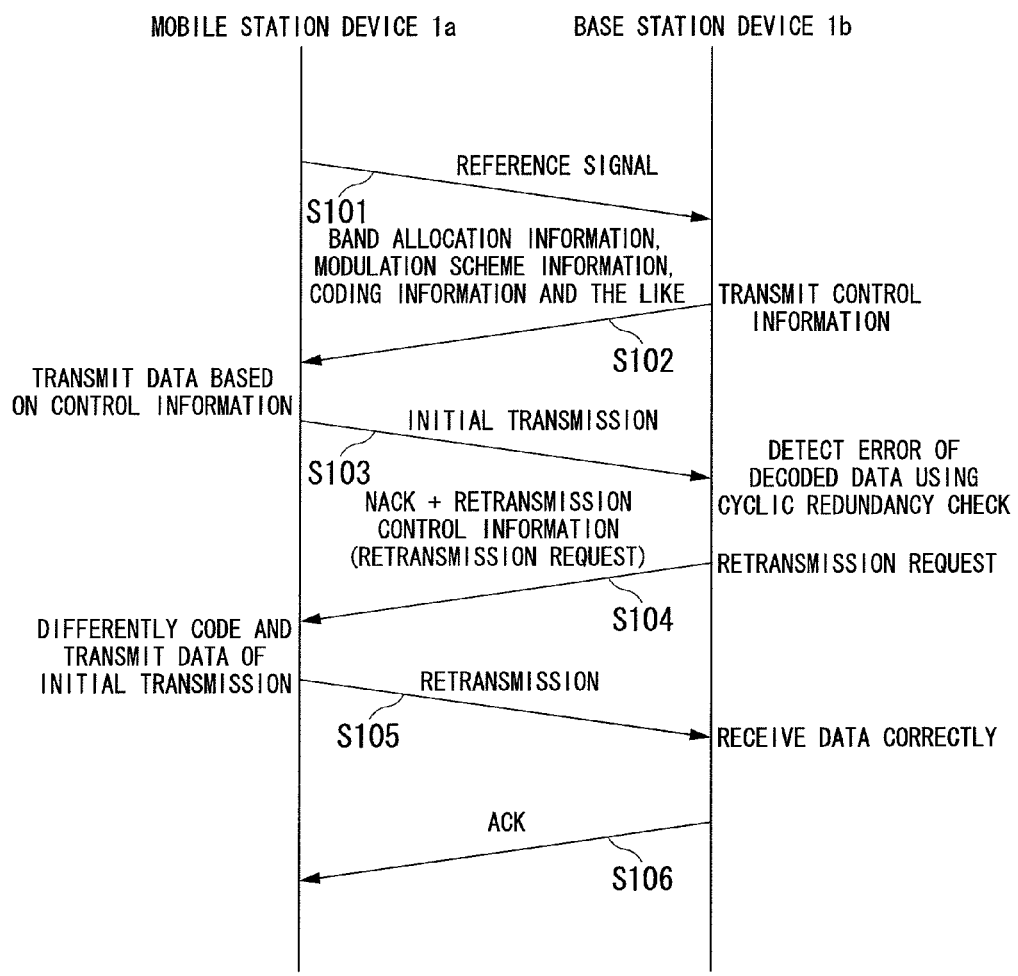
FIG. 8 is a sequence diagram illustrating an example of an operation of a communication system according to the present embodiment.

FIG. 8 is a sequence diagram illustrating an example of an operation of the communication system according to the present embodiment. Further, FIG. 8 illustrates an example of uplink communication from the mobile station device 1a to the base station device 1b. Further, FIG. 8 illustrates an example in which an error is detected in a first transmission and an error is not detected in a second transmission (a first retransmission).

(Step S101) The mobile station device 1a transmits a reference signal to the base station device 1b. This reference signal may be multiplexed with a data signal or only the reference signal may be transmitted without being multiplexed. Then, the process proceeds to step S102.

(Step S102) The base station device 1b receives the reference signal transmitted in step S101, and estimates a propagation path characteristic from the received reference signal. The base station device 1b determines control information (containing band allocation information, modulation scheme information, and coding information) for the mobile station device 1a based on the estimated propagation path characteristic. The base station device 1b transmits the determined control information to the mobile station device. Then, the process proceeds to step S103.

(Step S103) The mobile station device 1a receives the control information transmitted in step S103, and transmits a signal obtained by coding and modulating data bits (initial transmission) based on the received control information. Then, the process proceeds to step S104.

(Step S104) The base station device 1b receives the signal transmitted in step S103, and demodulates and decodes the received signal based on the control information notified of in S102. The base station device 1b performs cyclic redundancy check on the decoded data bits to check if the data bits have been acquired correctly. In the example of FIG. 8, it is determined that the data bits were not acquired correctly, i.e., an error is detected. In this case, the base station device 1b transmits an NACK signal and retransmission control information (containing band allocation information, modulation scheme information, and coding information) as a transmission acknowledgement signal. Then, the process proceeds to step S105.

Further, if it is determined that the data bits have been acquired correctly, the base station device 1b transmits ACK and completes transmission of the data bits.

(Step S105) The mobile station device 1a receives the transmission acknowledgement signal transmitted in step S104. The mobile station device 1a codes and modulates the same data bits as the data bits transmitted in step S103 based on the received transmission acknowledgement signal to generate a retransmission signal. Here, a constraint length used for retransmission coding is different from the constraint length used for coding in step S103. The mobile station device 1a transmits the generated retransmission signal, i.e., retransmits the signal of the data bits. Then, the process proceeds to step S106.

(Step S106) The base station device 1b receives the signal transmitted in step S105, and performs demodulation and decoding using the received retransmission signal and initial transmission signal. The base station device 1b performs cyclic redundancy check on the decoded data bits to check if the data bits have been acquired correctly. In the example of FIG. 8, it is determined that the data bits have been acquired correctly. In this case, the base station device 1b transmits the ACK signal as the transmission acknowledgement signal.

Thus, according to the present embodiment, the mobile station device 1a codes bits using a different constraint length from the constraint length used for the past transmission (initial transmission), to generate the retransmission signal, and transmits the generated retransmission signal. The reception device b1 repeatedly performs equalization using the bits decoded with a different constraint length from the constraint length used for past reception (initial transmission), which are bits of the retransmission signal. Accordingly, in the present embodiment, the communication system can improve communication quality. For example, as a constraint length shorter than the constraint length used for past communication is used, the communication system can converge turbo equalization and improve communication quality. Further, the communication system can converge the turbo equalization when the retransmission has been performed without converging the turbo equalization, and improve communication quality. Accordingly, in the communication system, it is possible to enhance an error rate characteristic in the retransmission and prevent degradation of cell throughput.

<Variant 1>

In the first embodiment, the case in which the coding information indicating the constraint length is transmitted from the base station device 1b to the mobile station device 1a has been described. In variant 1, a case in which the communication system selects the constraint length according to whether the transmission acknowledgement signal is ACK or NACK will be described.

In the present variant, the coding scheme selection unit C113 and the retransmission control determination unit D109 store a constraint length table (FIG. 9) in advance.

FIG. 9 is a schematic diagram illustrating an example of the constraint length table according to variant 1. As shown, the constraint length table has columns of items: a transmission type indicating initial transmission or retransmission, and a constraint length. The constraint length table is two-dimensional table-format data including rows and columns in which information indicating the constraint length is stored for each transmission type. In FIG. 9, for example, when the transmission type is "initial transmission," the constraint length "4" is associated therewith, and when the transmission type is "retransmission," the constraint length "3" is associated therewith.

The coding scheme selection unit C113 determines whether the transmission acknowledgement signal is ACK or NACK to determine whether the transmission type is the initial transmission or the retransmission. When the transmission type is ACK (the initial transmission), the coding scheme selection unit C113 outputs the bit sequence to the second coding unit C115 in which the constraint length is "4." On the other hand, when the transmission type is NACK (retransmission), the coding scheme selection unit C113 outputs the bit sequence to the third coding unit C116 in which the constraint length is "3."

Thus, according to the present variant 1, the constraint length can be changed without transmitting the coding information indicating the constraint length from the base station device 1b to the mobile station device 1a, and transmission efficiency can be improved.

<Variant 2>

In the first embodiment, the case in which the constraint length is determined according to whether transmission is retransmission or initial transmission has been described. In variant 2, a case in which the communication system selects the constraint length according to the number of transmissions will be described.

The coding scheme selection unit C113 and the retransmission control determination unit D109 according to variant 2 store a constraint length table (FIG. 10) in advance.

FIG. 10 is a schematic diagram illustrating an example of a constraint length table according to variant 2. As shown, the constraint length table has columns of items: the number of transmissions and the constraint length. The constraint length table is two-dimensional table-format data including rows and columns in which information indicating the constraint length is stored for each of the numbers of transmissions. In FIG. 10, for example, when the number of transmissions is "1" to "2," the constraint length "4" is associated therewith, and when the number of transmissions is "3" or more, the constraint length "3" is associated therewith.

The coding scheme selection unit C113 and the retransmission control determination unit D109 count the number of transmissions. The coding scheme selection unit C113 and the retransmission control determination unit D109 selects the constraint length corresponding to the counted number of transmissions based on the constraint length table stored in advance.

Further, only the retransmission control determination unit D109 may store the constraint length table and may select the constraint length based on the constraint length table. In this case, the retransmission control determination unit D109 transmits coding information indicating the selected constraint length to the mobile station device 1a.

Further, communication in which constraint lengths are different is not limited to the initial transmission and the retransmission. For example, the coding scheme selection unit C113 and the retransmission control determination unit D109 may select a coding length to be different between first retransmission (the number of transmissions "2") and second retransmission (the number of transmissions "3") as illustrated in FIG. 10. In other words, past transmission in which a constraint length is different is not limited to the initial transmission and may be the retransmission.

<Variant 3>

As another variant of the first embodiment, the present invention is not limited to the above decoding method when turbo coding by a constraint length "4" (the first coding unit C114 and the second coding unit C115) is performed in initial transmission, and turbo coding by a constraint length "3" (the first coding unit C114 and the third coding unit C116) is partially performed in retransmission. For example, in the first embodiment, the code control unit D104 may switch an output destination according to the number of turbo decoding iterations.

The variant is as follows.

In FIG. 7, the systematic bits that are an output from the first decoding unit D102 are sorted by the interleaver D103 and the sorted bits are input to the decoding control unit 104. In initial transmission, the decoding control unit D104 inputs the systematic bits input from the interleaver D103 to the second decoding unit D105. A decoding result in the second decoding unit D105 is input to the first decoding unit D102 via the de-interleaver D107. Thus, in the initial transmission, turbo decoding is similar to turbo decoding of related art in the first decoding unit D102 and the second decoding unit D105.

Meanwhile, in retransmission, the decoding control unit D104 inputs the systematic bits input from the interleaver D103 to the third decoding unit D106. A decoding result of the third decoding unit D106 is input to the first decoding unit D102 via the de-interleaver D107. Here, a decoding result in the first decoding unit D102 is output to the decoding control unit D104 via the interleaver D103 again, but the decoding control unit D104 changes the decoding unit to which the decoding result is to be output. In a second process of turbo decoding, the decoding control unit D104 outputs the input bit to the second decoding unit D105 rather than the third decoding unit D106 used in the first decoding process. In the second decoding unit D105, decoding is performed using the parity bit transmitted in the initial transmission and a decoding result is output to the de-interleaver D107. The de-interleaver D107 performs a sorting process reverse to the interleaver and outputs the sorted bit to the first decoding unit D102. The decoding process is performed by iteratively performing such a process. Accordingly, in the decoding unit D1, the third decoding unit D106 is used in the odd-numbered processes such as the first, third and fifth processes in the turbo decoding iteration process, and the second decoding unit D105 is used in the even-numbered processes such as the second, fourth and sixth processes.

Thus, in the decoding unit D1 as in the present variant 3, the received parity bit of the initial transmission and the retransmission can be utilized as in the case in which the constraint length is not changed in the initial transmission and the retransmission, an error rate characteristic in the retransmission can be enhanced, and degradation of cell throughput can be prevented.

<Variant 4>

Figure 11:
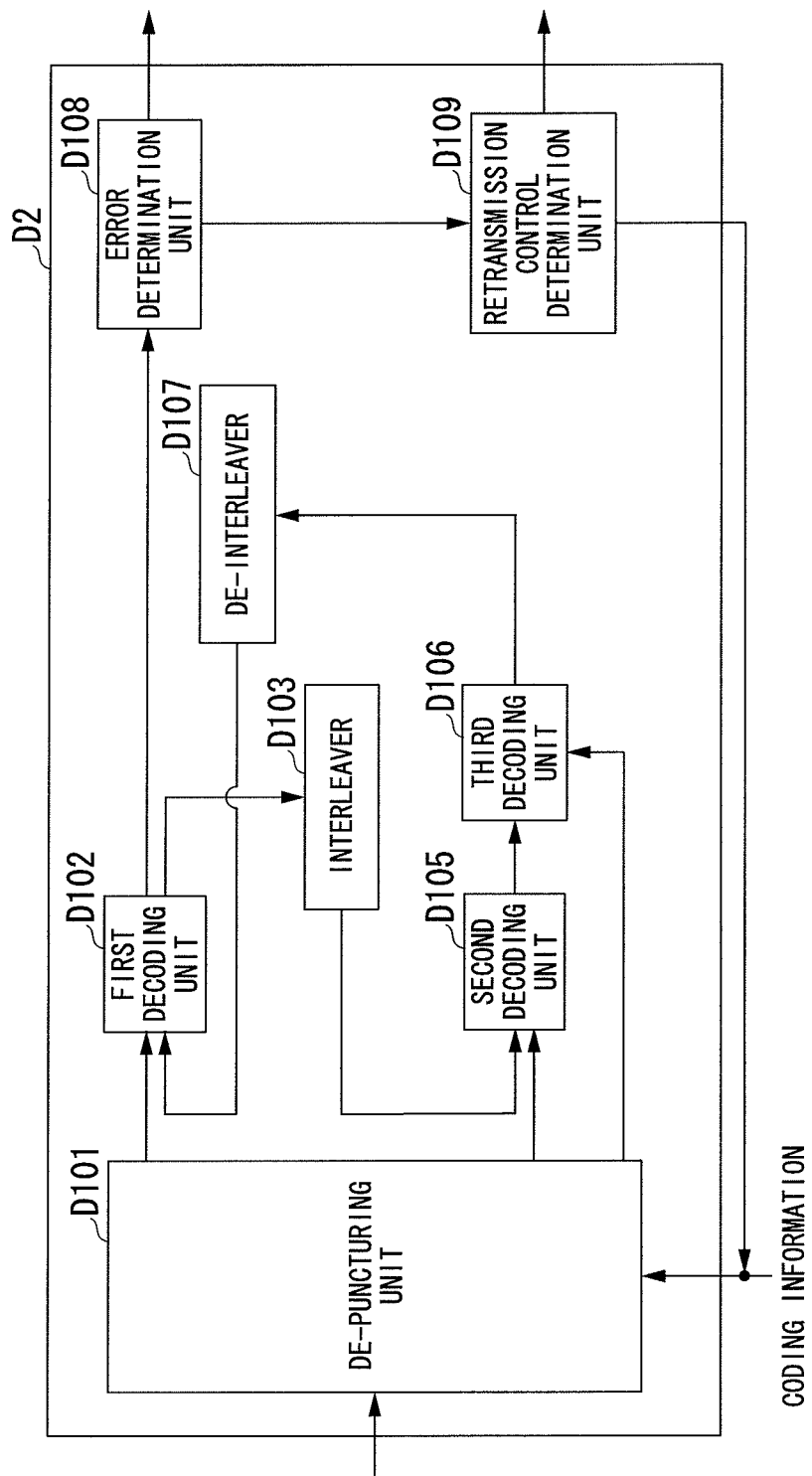
FIG. 11 is a schematic diagram illustrating a configuration of a coding unit according to variant 4.

The configuration of the decoding unit D1 is not limited thereto and may be a configuration of a decoding unit D2 as illustrated in FIG. 11.

FIG. 11 is a schematic diagram illustrating a configuration of the decoding unit D2 according to variant 4. In FIG. 11, a second decoding unit D105 and a third decoding unit D106 are connected in series. In this case, the systematic bit 14 output from the interleaver D103 is decoded by the second decoding unit D105 when the constraint length is "4" and by the third decoding unit D106 when the constraint length is "3," and output to a de-interleaver D107.

Accordingly, according to the present variant 4, in the decoding unit D2, communication with a changed constraint length can be performed without the code control unit D104, and a circuit or a program can be simplified as compared to the decoding unit D1.

Further, the case in which, in the decoding units D1 and D2, the initial transmission signal is decoded by the first decoding unit D102 and a decoding result of the first decoding unit D102 is used as a priori information for the second decoding unit D105 or the third decoding unit D106 has been described. However, the present invention is not limited thereto and the decoding unit D1 may have a configuration in which the retransmission signal is first decoded and a decoding result is used as a priori information for the first decoding unit D102.

(Second Embodiment)

Hereinafter, a second embodiment of the present invention will be described in detail with reference to the drawings. In the present embodiment, a case in which a communication system performs sorting of order of bits using different sorting from sorting for past transmission will be described. Further, in the present embodiment, a case in which the communication system selects the constraint length according to whether the transmission acknowledgement signal is ACK or NACK will be described. However, the present invention is not limited thereto, and in the communication system, a base station device 1b may determine a constraint length and transmit coding information indicating the determined constraint length to the mobile station device 1a, as in the first embodiment.

Hereinafter, in the present embodiment, the mobile station devices 2A and 3A of FIG. 1 are referred to as a mobile station device 2a, and the base station device 1B is referred to as a base station device 2b.

<Mobile Station Device 2a>

Figure 12:
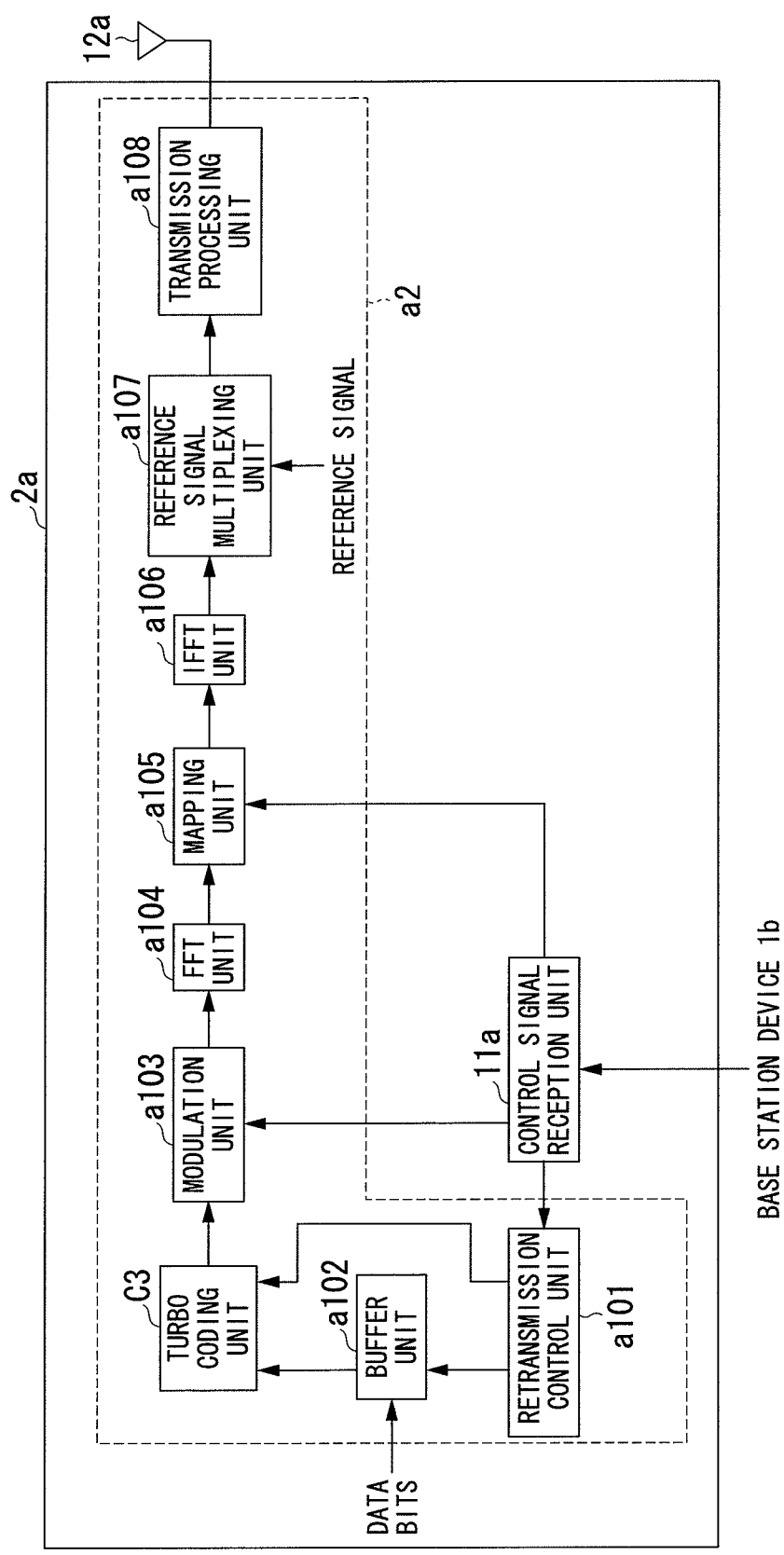
FIG. 12 is a schematic block diagram illustrating a configuration of a mobile station device according to a second embodiment of the present invention.

FIG. 12 is a schematic block diagram illustrating a configuration of the mobile station device 2a according to the second embodiment of the present invention. If the mobile station device 2a (FIG. 12) according to the present embodiment is compared with the mobile station device 1a (FIG. 2) according to the first embodiment, the turbo coding unit C3 of the transmission device a2 is different. However, functions of other components (a control signal reception unit 11a, a transmission antenna 12a, a retransmission control unit a101, a buffer unit a102, a modulation unit a103, an FFT unit a104, a mapping unit a105, an IFFT unit a106, a reference signal multiplexing unit a107, and a transmission processing unit a108) are the same as those in the first embodiment. A description of the same functions as those in the first embodiment will be omitted.

Figure 13:
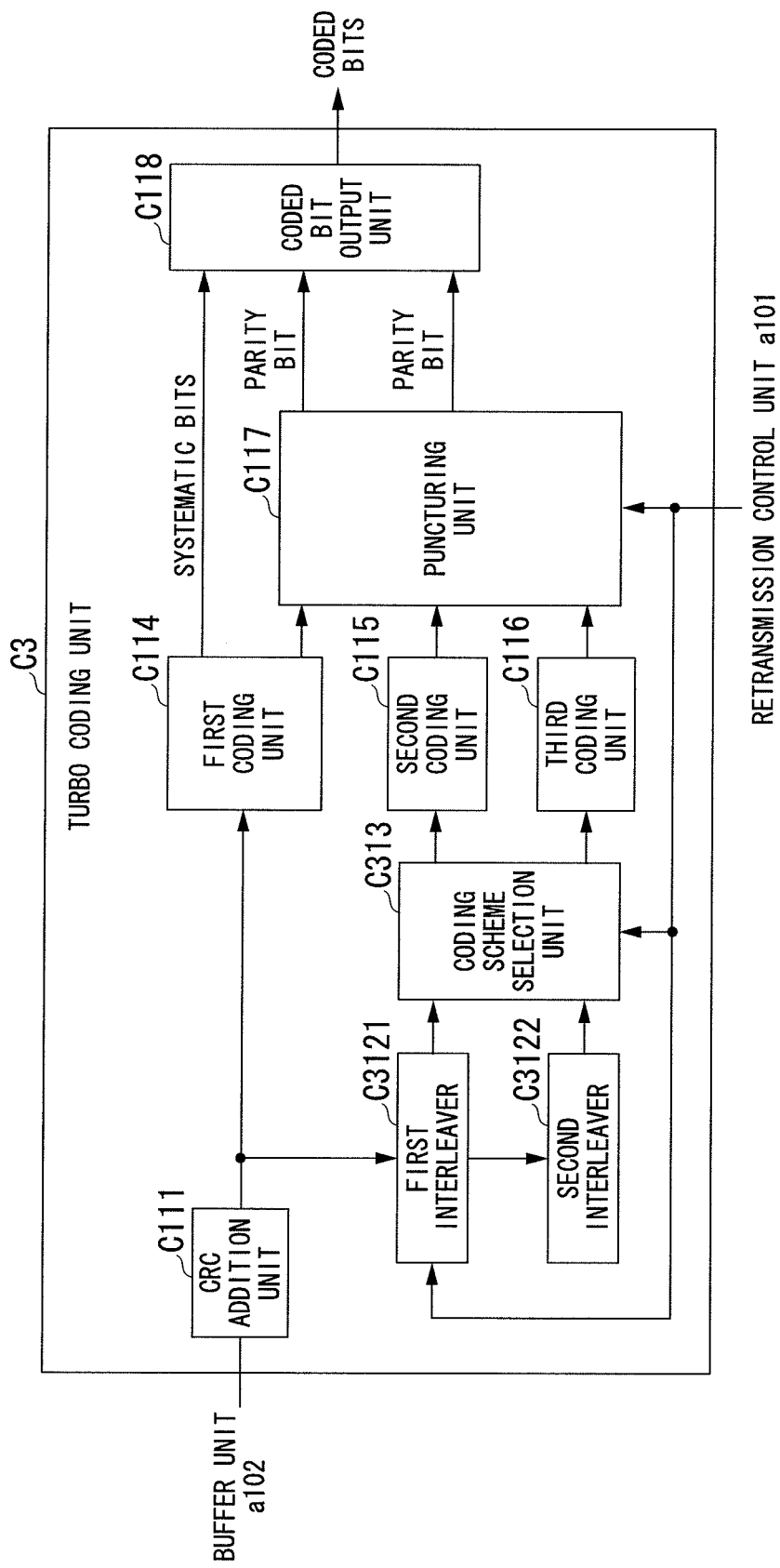
FIG. 13 is a schematic block diagram illustrating a configuration of a turbo coding unit according to the present embodiment.

FIG. 13 is a schematic block diagram illustrating a configuration of the turbo coding unit C3 according to the present embodiment. If the turbo coding unit C3 (FIG. 13) according to the present embodiment is compared with the turbo coding unit C1 (FIG. 3) according to the first embodiment, the first interleaver C3121, the second interleaver C3122, and the coding scheme selection unit C313 are different. However, functions of other components (the turbo coding unit C1, a CRC addition unit C111, a first coding unit C 114, a second coding unit C115, a third coding unit C116, a puncturing unit C117, and coded bit output unit C118) are the same as those in the first embodiment. A description of the same functions as those in the first embodiment will be omitted.

The first interleaver C3121 sorts (interleaves) a bit sequence input from the CRC addition unit C111 in a predetermined order. Meanwhile, the first interleaver C3121 receives the transmission acknowledgement signal from the retransmission control unit a101. The first interleaver C3121 determines whether the input transmission acknowledgement signal is ACK or NACK. In other words, the first interleaver C3121 determines whether a bit sequence to be processed is for initial transmission or for retransmission.

If the transmission acknowledgement signal is determined to be ACK, the first interleaver C3121 outputs the sorted bit sequence to the coding scheme selection unit C113. On the other hand, if the transmission acknowledgement signal is determined to be NACK, the first interleaver C3121 outputs the sorted bit sequence to the second interleaver C3122.

The second interleaver C3122 sorts (interleaves) the bit sequence input from the first interleaver C3121 in a predetermined order and outputs the sorted bit sequence to the coding scheme selection unit C113. Here, the second interleaver C3122 sorts the bit sequence to have a different order from the bit sequences output by the CRC addition unit C11 and the first interleaver C3121.

The coding scheme selection unit C313 receives the transmission acknowledgement signal from the retransmission control unit a101. The coding scheme selection unit C313 determines whether the input transmission acknowledgement signal is ACK or NACK.

If the transmission acknowledgement signal is determined to be ACK, the coding scheme selection unit C313 outputs the bit sequence input from the first interleaver C3121 to the second coding unit C115. On the other hand, if the transmission acknowledgement signal is determined to be NACK, the coding scheme selection unit C313 outputs the bit sequence input from the second interleaver C3122 to the third coding unit C116.

According to the above configuration, in the case of the initial transmission, the bit sequence output from the first interleaver C3121 is coded by the second coding unit C115. On the other hand, in the case of the retransmission, the bit sequence output from the first interleaver C3121 is interleaved by the second interleaver C3122 and coded by the third coding unit C116.

<Base Station Device 2b>

Figure 14:
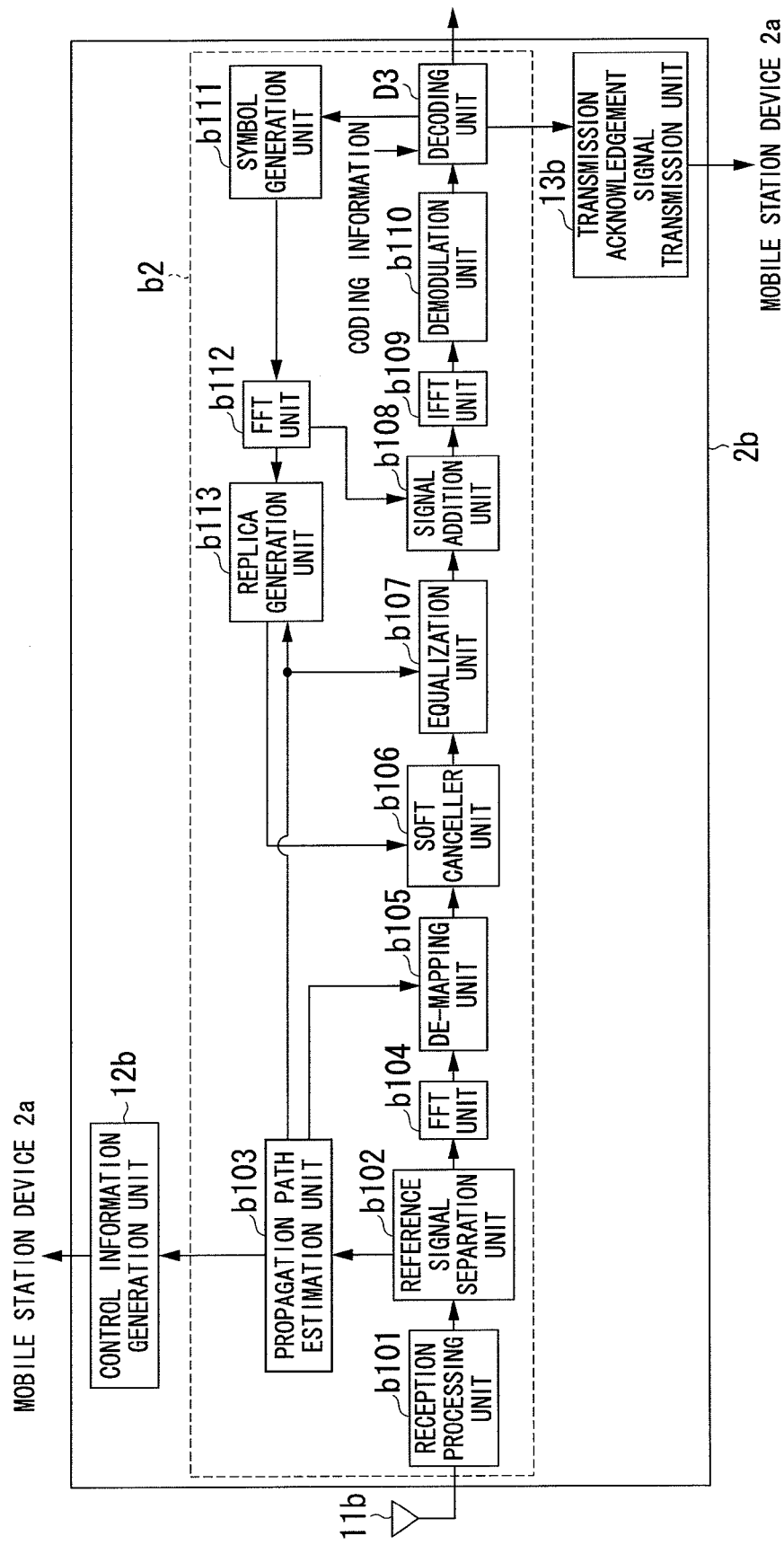
FIG. 14 is a schematic block diagram illustrating a configuration of a base station device according to the present embodiment.

FIG. 14 is a schematic block diagram illustrating a configuration of the base station device 2b according to the present embodiment. If the base station device 2b (FIG. 14) according to the present embodiment is compared with the base station device 1b (FIG. 6) according to the first embodiment, a turbo decoding unit D3 of a reception device b2 is different. However, functions of other components (a reception antenna 11b, a control information generation unit 12b, a transmission acknowledgement signal transmission unit 13b, a reception processing unit b101, a reference signal separation unit b102, a propagation path estimation unit b103, an FFT unit b104, a de-mapping unit b105, a soft canceller unit b106, an equalization unit b107, an IFFT unit b109, a demodulation unit b110, a symbol generation unit b111, an FFT unit b112, and a replica generation unit b113) are the same as those in the first embodiment. A description of the same functions as those in the first embodiment will be omitted.

<Decoding Unit D3>

Figure 15:
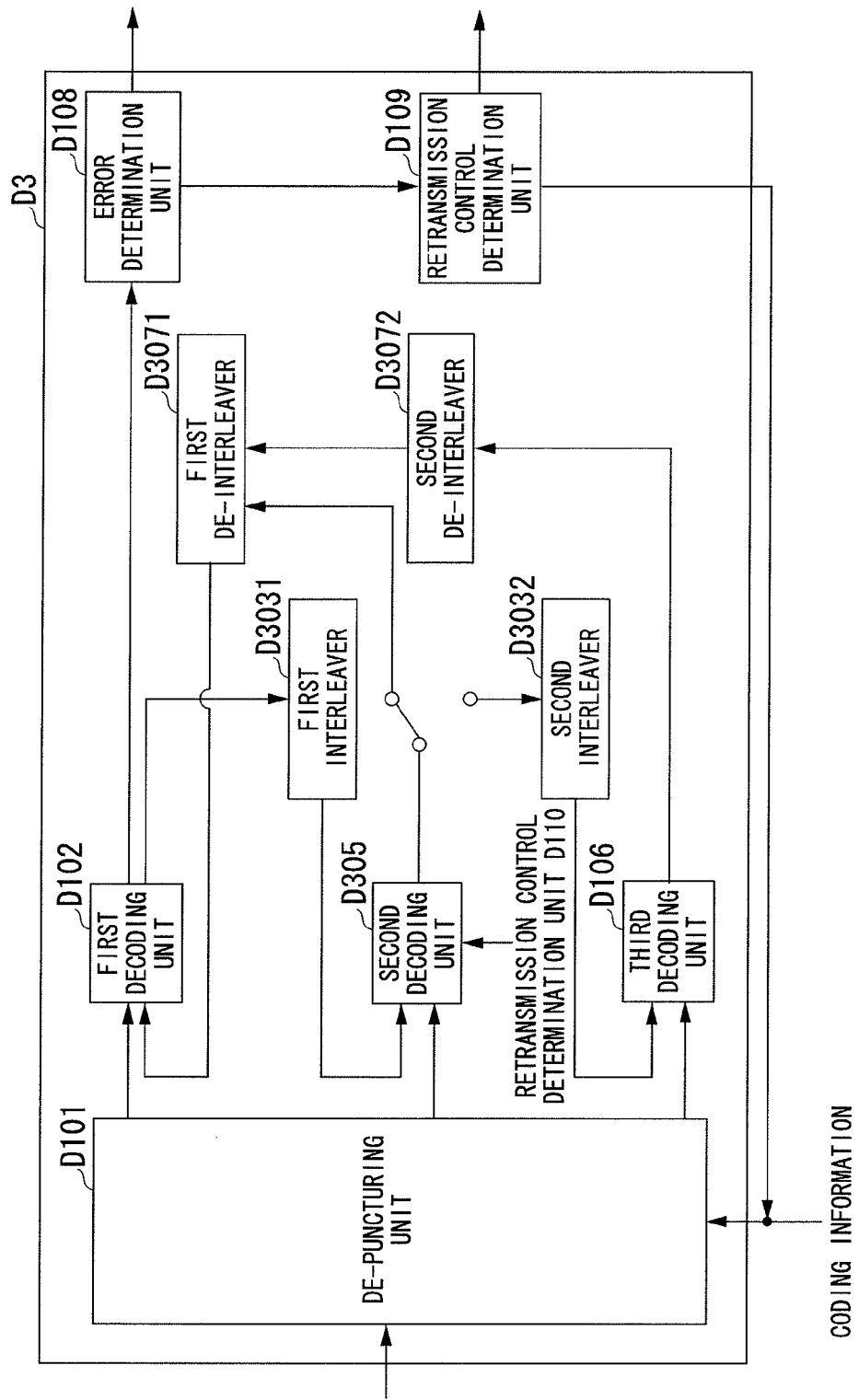
FIG. 15 is a schematic block diagram illustrating a configuration of a decoding unit according to the present embodiment.

FIG. 15 is a schematic block diagram illustrating a configuration of the decoding unit D3 according to the present embodiment. If the decoding unit D3 (FIG. 15) according to the present embodiment is compared with the decoding unit D1 (FIG. 7) according to the first embodiment, a second decoding unit D305, a first interleaver D3031, a second interleaver D3032, a first de-interleaver D3071, and a second de-interleaver D3072 are different. However, functions of other components (a de-puncturing unit D101, a first decoding unit D102, a decoding control unit D104, a third decoding unit D106, an error determination unit D108, and a retransmission control determination unit D109) are the same as those in the first embodiment. A description of the same functions as those in the first embodiment will be omitted.

The first interleaver D3031 sorts (interleaves) the systematic bit 13 input from the first decoding unit D102 in a predetermined order, and outputs the sorted systematic bit to the second decoding unit D305 (the bit sequence after the sorting is referred to as a systematic bit 14). Here, the predetermined order is the same as the order used by the first interleaver C3121 of the turbo coding unit C3.

The second decoding unit D305 stores the parity bit 22 input from the de-puncturing unit D101. The second decoding unit D305 performs a decoding process based on MAP estimation using the stored parity bit 22 and the systematic bit 14 input from the first interleaver D3031. Accordingly, the second decoding unit D305 performs error correction on the interleaved desired data bits (referred to as systematic bits 15).

The second decoding unit D305 receives the transmission acknowledgement signal from the retransmission control determination unit D109. The second decoding unit D305 determines whether the input transmission acknowledgement signal is ACK or NACK. If the transmission acknowledgement signal is determined to be ACK, the second decoding unit D305 outputs the systematic bit 15 subjected to the error correction to the first de-interleaver D3071. On the other hand, if the transmission acknowledgement signal is determined to be NACK, the second decoding unit D305 outputs the systematic bit 15 subjected to the error correction to the second interleaver D3032. Further, in this case, the second decoding unit D305 switches a switch to be connected to the second interleaver D3032.

The second interleaver D3032 sorts (interleaves) the systematic bit 15 input from the second decoding unit D305 in a predetermined order, and outputs the sorted systematic bit to the third decoding unit D106 (the bit sequence after the sorting is referred to as a systematic bit 17). Here, the predetermined order is the same as the order used by the second interleaver C3122 of the turbo coding unit C3.

Further, the systematic bit 17 is decoded by the third decoding unit D106, and output to the second de-interleaver D3072.

The second de-interleaver D3072 sorts the bit sequence output from the third decoding unit D106 in a predetermined order and outputs the sorted bit sequence to the first de-interleaver D3071 (the bit sequence after the sorting is referred to a systematic bit 18). Here, the predetermined order is reverse to the order used by the second interleaver D3032.

The first de-interleaver D3071 sorts the systematic bit 15 input from the second decoding unit D305 or the systematic bit 18 input from the second de-interleaver D3072 in a predetermined order, and outputs the sorted systematic bit to the first decoding unit D102 (the bit sequence after the sorting is a systematic bit 12). Here, the predetermined order is reverse to the order used by the first interleaver D3031.

According to the above configuration, in the case of initial transmission, the bit sequence output from the second decoding unit D305 is output to the first de-interleaver D3071. On the other hand, in the case of retransmission, the bit sequence output from the second decoding unit D305 is interleaved by the second interleaver D3032 and decoded by the third decoding unit D106. Then, the decoded bit sequence is de-interleaved by the second de-interleaver D3072 and output to the first de-interleaver D3071.

Thus, according to the present embodiment, the transmission device a2 sorts the bit sequence by a different sorting from the sorting used for a past transmission (initial transmission) and codes the bit sequence, and the reception device b2 sorts the bit sequence by a different sorting from the sorting used for a past reception (initial transmission) and decodes the bit sequence. Accordingly, in the present embodiment, the communication system can converge the turbo equalization and improve the communication quality. Accordingly, it is possible to enhance an error rate characteristic in the retransmission and prevent degradation of a cell throughput in the communication system.

Further, in the second embodiment, communication in which the bit sorting is different is not limited to the initial transmission and the retransmission. For example, the first interleaver C3121, the coding scheme selection unit C113, and the second decoding unit D305 may select an output destination to be different between the first retransmission (the number of transmissions "2") and the second retransmission (the number of transmissions "3"). In other words, past transmission in which the bit sorting is different is not limited to the initial transmission and may be retransmission.

Further, the configurations of the turbo coding unit C3 and the decoding unit D3 are not limited thereto and the bit sequence input to the coding scheme selection unit C113 may differ according to the type (ACK or NACK) of the transmission acknowledgement signal. For example, the predetermined orders used by the first interleaver C3121 and the second interleaver C3122 may be the same orders or may be different orders. Further, the configurations may be the configurations of the turbo coding unit C4 and the decoding unit D4 as illustrated in FIG. 16 or 17.

<Variant 5>

Figure 16:
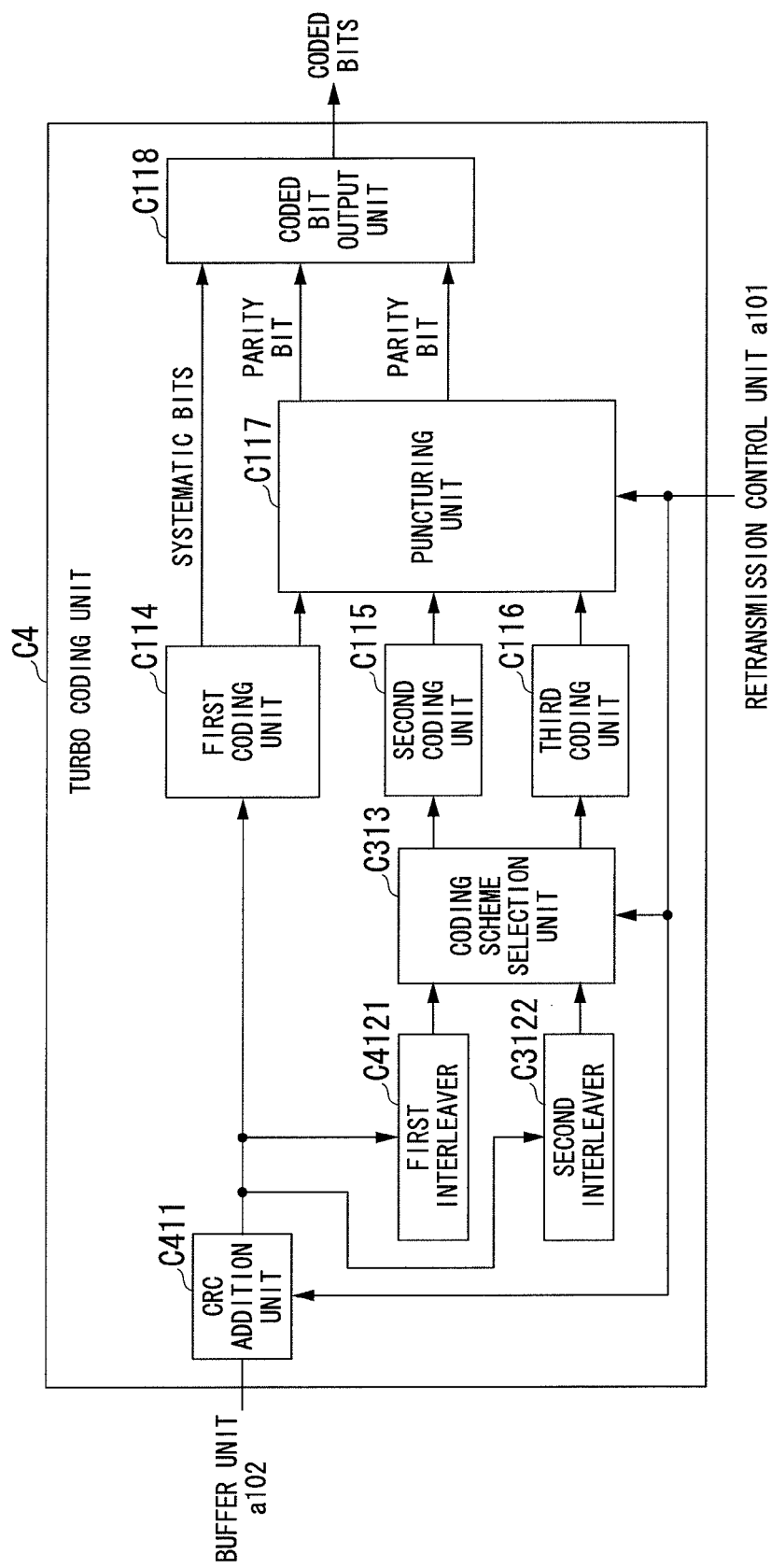
FIG. 16 is a schematic block diagram illustrating a configuration of a turbo coding unit according to variant 5.
Figure 17:
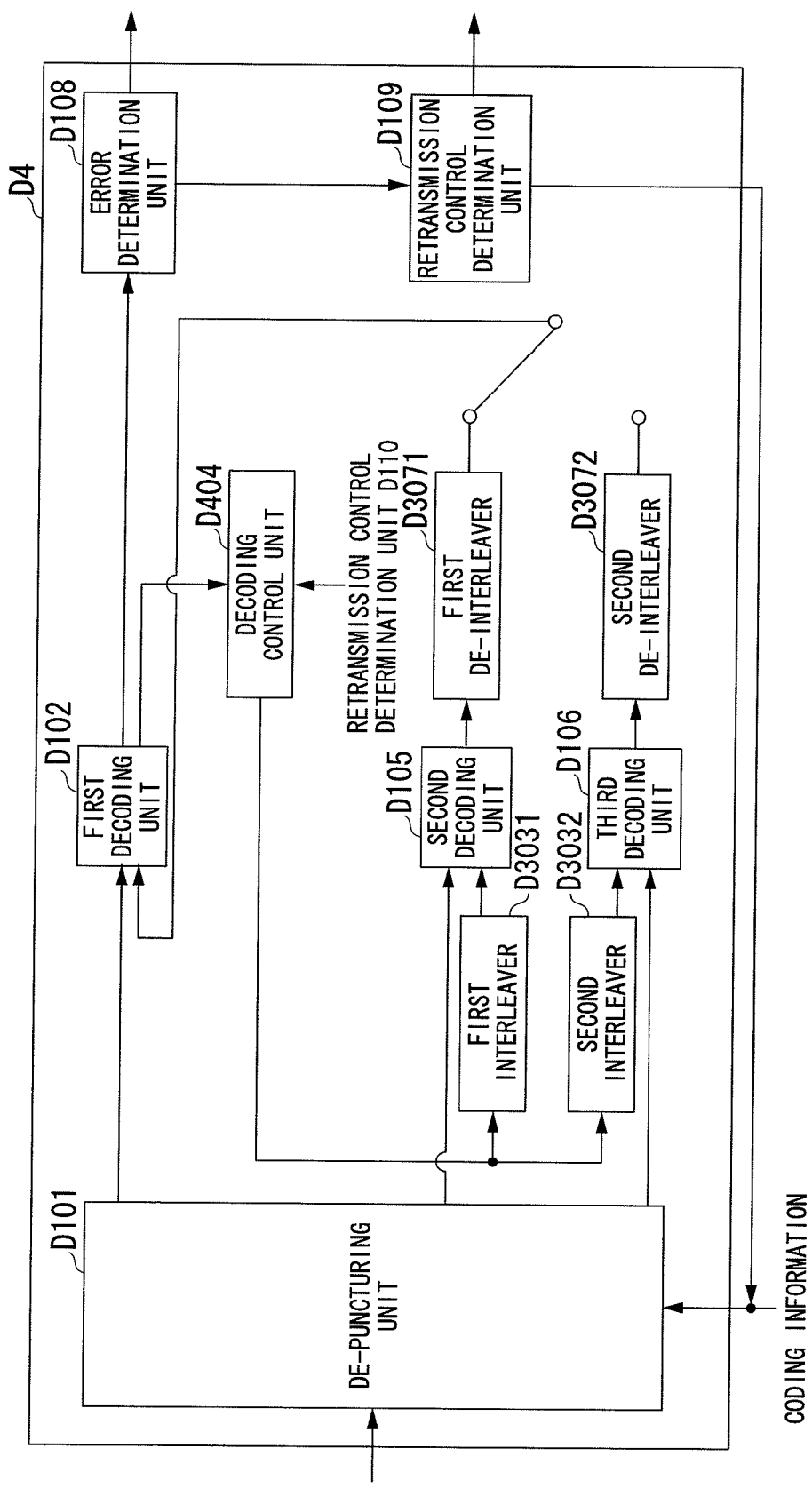
FIG. 17 is a schematic block diagram illustrating a configuration of a decoding unit according to variant 5.

FIG. 16 is a schematic block diagram illustrating a configuration of a turbo coding unit C4 according to variant 5. If the turbo coding unit C4 (FIG. 16) according to the present variant is compared with the turbo coding unit C3 (FIG. 13) according to the second embodiment, a CRC addition unit C411 and a first interleaver C4121 are different. However, functions of other components are the same as those in the first embodiment. A description of the same functions as those in the first embodiment will be omitted.

The CRC addition unit C411 receives the bit sequence (an initial transmission data bit sequence or a retransmission data bit sequence) from the buffer unit a102. The CRC addition unit C411 adds a bit for cyclic redundancy check to the input bit sequence and outputs a resultant bit sequence to the first coding unit C114. Further, the CRC addition unit C411 receives the transmission acknowledgement signal from the retransmission control unit a101. The CRC addition unit C411 determines whether the input transmission acknowledgement signal is ACK or NACK.

If the transmission acknowledgement signal is determined to be ACK, the CRC addition unit C411 outputs the sorted bit sequence to the first interleaver C4121. On the other hand, if the transmission acknowledgement signal is determined to be NACK, the CRC addition unit C411 outputs the sorted bit sequence to the second interleaver C3122.

The first interleaver C4121 sorts (interleaves) the bit sequence input from the CRC addition unit C411 in a predetermined order, and outputs the sorted bit sequence to the coding scheme selection unit C313.

<Decoding Unit D4>

FIG. 17 is a schematic block diagram illustrating a configuration of a decoding unit D4 according to variant 5. If the decoding unit D4 (FIG. 17) according to the present variant 5 is compared with the decoding unit D3 (FIG. 15) according to the second embodiment, a code control unit D404 and a second decoding unit D105 are different. However, functions of other components are the same as those in the second embodiment. A description of the same functions as those in the second embodiment will be omitted. Further, since the function of the second decoding unit D105 is the same as that in the first embodiment, a description thereof will be omitted.

The code control unit D404 receives the transmission acknowledgement signal from the retransmission control determination unit D111. The code control unit D404 determines whether the input transmission acknowledgement signal is ACK or NACK. If the transmission acknowledgement signal is determined to be ACK, the code control unit D404 outputs the systematic bit 13 input from the first decoding unit D102 to the first interleaver D3031. On the other hand, if the transmission acknowledgement signal is determined to be NACK, the code control unit D404 outputs the systematic bit 13 input from the first decoding unit D102 to the second interleaver D3032.

Further, while a case in which the first decoding unit D102 is connected to the first de-interleaver D3071 is described in FIG. 17, a connection of the first decoding unit D102 is switched to any one of the first de-interleaver D3071 and the second de-interleaver D3072. Specifically, the first decoding unit D102 is connected to the first de-interleaver D3071 or the second de-interleaver D3072 according to whether the transmission acknowledgement signal is ACK or NACK.

Further, in variant 5, the code control unit D404 may switch an output destination according to the number of turbo decoding iterations.

The systematic bit that is an output from the first decoding unit D102 is input to the decoding control unit 104.

In initial transmission, the decoding control unit D404 inputs the input systematic bit to the first interleaver D3031. The systematic bit is sorted by the first interleaver D3031, and the sorted bit is input to the second decoding unit D105. A decoding result in the second decoding unit D105 is input to the first decoding unit D102 via the first de-interleaver D3071.

Meanwhile, in retransmission, the decoding control unit D404 inputs the input systematic bit to the second interleaver D3032. The systematic bit is sorted by the second interleaver D3032 and the sorted bit is input to the third decoding unit D106. A decoding result in the third decoding unit D106 is input to the first decoding unit D102 via the second de-interleaver D3072. Here, a decoding result in the first decoding unit D102 is input to the decoding control unit D404 again, but the decoding control unit D404 changes the interleaver to which the result is to be output. In the second process of turbo decoding, the decoding control unit D404 outputs the input bit to the first interleaver D3031 rather than the second interleaver D3032 used in the first decoding process. The bits sorted by the first interleaver are decoded using the parity bit transmitted in the initial transmission by the second decoding unit D105. The second decoding unit D105 outputs the decoding result to the first de-interleaver D3071. The first de-interleaver D3071 performs a sorting process reverse to the first interleaver D3031, and outputs the sorted bits to the first decoding unit D102. A decoding process is performed by iteratively performing this process. Accordingly, in the decoding unit D4, the second interleaver 3032, the third decoding unit D106, and the second de-interleaver D3072 are used in the odd-numbered processes such as the first, third and fifth processes in the turbo decoding iteration process. On the other hand, the first interleaver D3031, the second decoding unit D105, and the first de-interleaver D3071 are used in the even-numbered processes such as the second, fourth and sixth processes.

<Variant 6>

Figure 18:
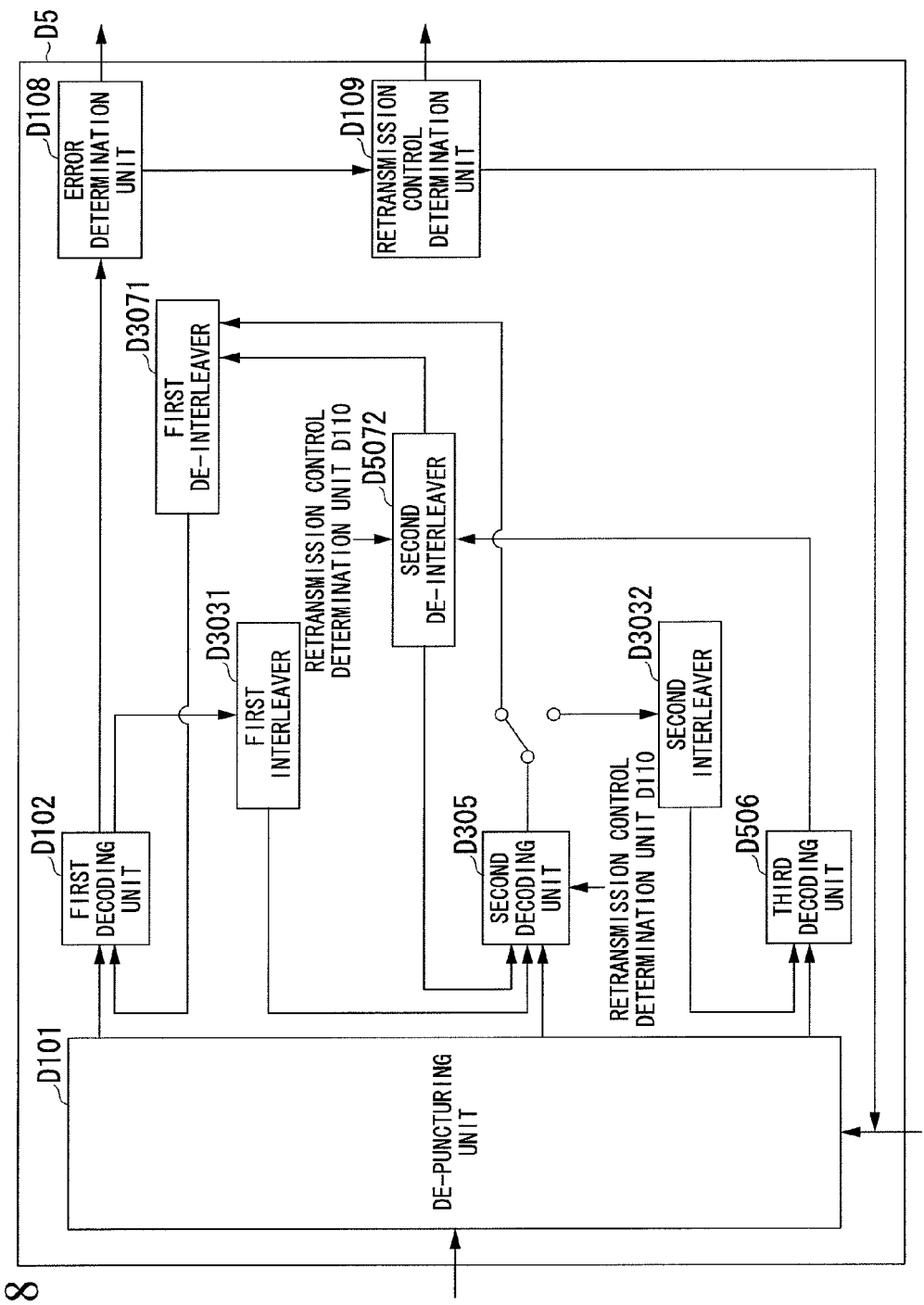
FIG. 18 is a schematic block diagram illustrating a configuration of a decoding unit D5 according to variant 6.

Further, the configuration of the decoding unit D3 is not limited thereto and may be the same as that of a decoding unit D4 as shown in FIG. 18.

FIG. 18 is a schematic block diagram illustrating a configuration of the decoding unit D5 according to variant 6. If the decoding unit D5 (FIG. 18) according to the present variant is compared with the decoding unit D3 (FIG. 15) according to the second embodiment, a second de-interleaver D5072 and a third decoding unit D506 are different. However, functions of other components are the same as those in the second embodiment. A description of the same functions as those in the second embodiment will be omitted.

The third decoding unit D506 stores a parity bit 22 input from a de-puncturing unit D101. The third decoding unit D506 performs a decoding process based on MAP estimation using the stored parity bit 22 and a systematic bit 17 input from a second interleaver D3032 to perform error correction on the interleaved desired data bits (referred to as systematic bits 16). Here, the third decoding unit D506 performs a decoding process of a constraint length "3."

The third decoding unit D506 outputs the systematic bit 16 subjected to the error correction to the second de-interleaver D5072.

The second de-interleaver D5072 sorts the systematic bit 16 output from the third decoding unit D506 in a predetermined order. Here, the predetermined order is reverse to the order used by the second interleaver D3032.

The second de-interleaver D5072 counts the number of times the process has been performed and determines whether the process has been performed a predetermined number of times to determine whether a series of decoding processes of the second decoding unit D305, the second interleaver D3032, the third decoding unit D506, and the second de-interleaver D5072 have been performed a predetermined number of times. If the process has been performed a predetermined number of times, the second de-interleaver D5072 outputs the sorted bit sequence to the first de-interleaver D3071, and when the decoding process has not been performed a predetermined number of times, the second de-interleaver D5072 outputs the sorted bit sequence to the second decoding unit D305.

According to the configuration of the decoding unit D5, in the case of retransmission, bits input from the first interleaver D3031 to the second decoding unit D305 are subjected to a series of decoding processes of the second decoding unit D305, the second interleaver D3032, the third decoding unit D506, and the second de-interleaver D5072 a predetermined number of times (this process is referred to as a decoding process A). Further, in the case of retransmission, the bits input from the de-puncturing unit D101 to the first decoding unit D102 are subjected to the process in the first decoding unit D102, the process in the first interleaver, the decoding process A, and the process in the first de-interleaver D3071 a predetermined number of times, and input to the error determination unit D108.

(Third Embodiment)

Hereinafter, a third embodiment of the present invention will be described in detail with reference to the drawings. In the present embodiment, a case in which a plurality of mobile station devices (or a plurality of antennas) simultaneously transmit signals using the same frequency and the base station device receives the signals will be described.

Figure 19:
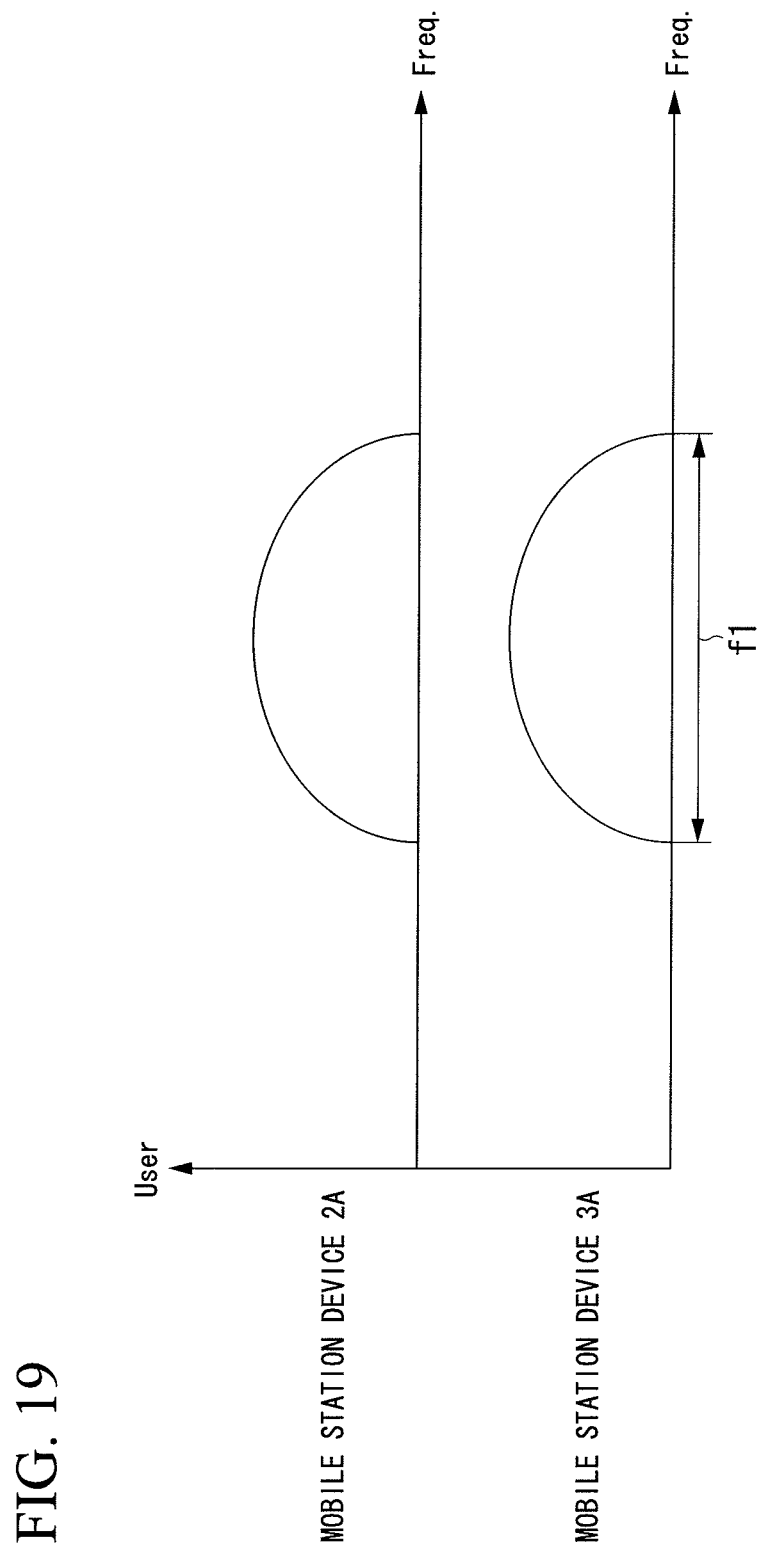
FIG. 19 is a schematic diagram illustrating an example of an allocation of signals according to a third embodiment of the present invention.
Figure 20:
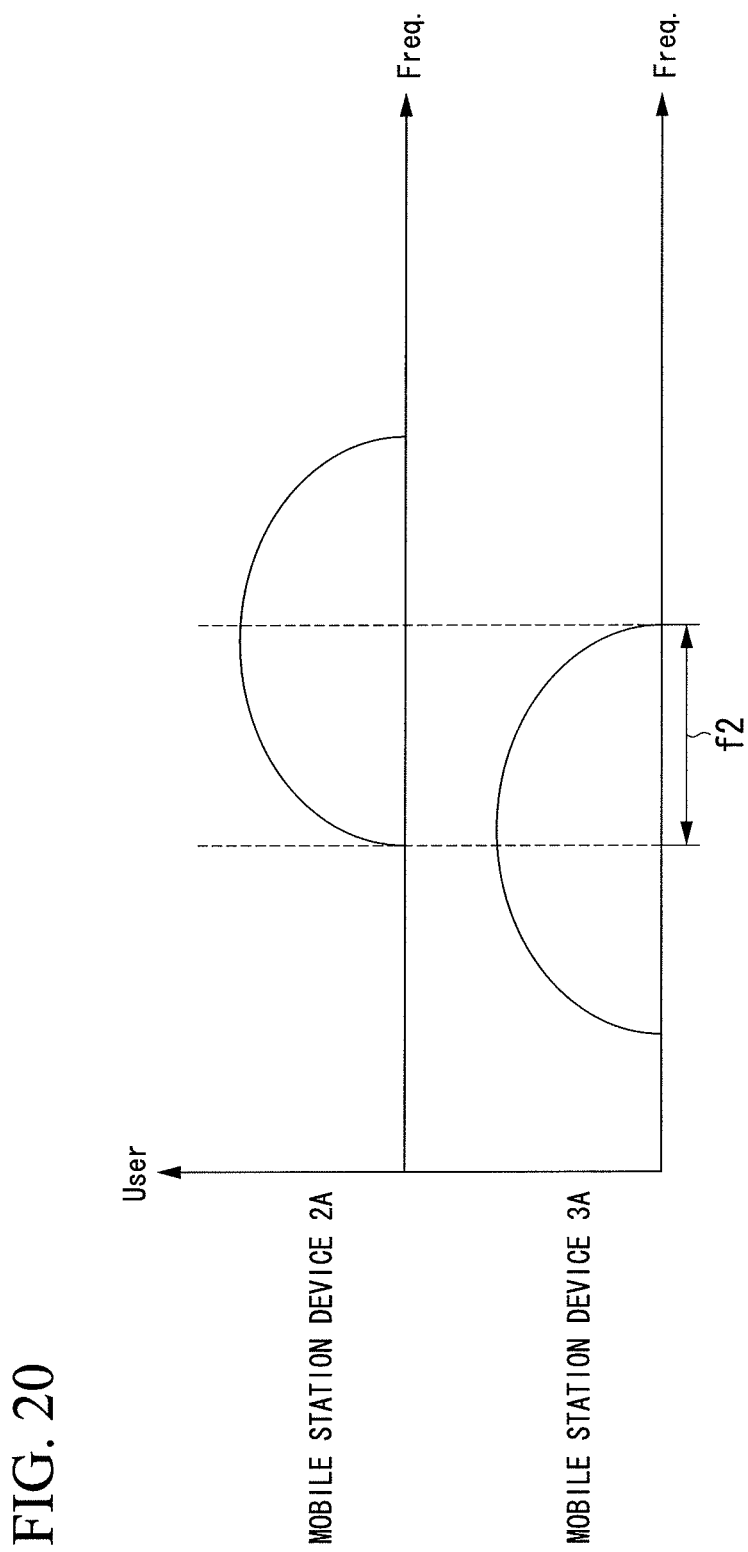
FIG. 20 is a schematic diagram illustrating another example of an allocation of signals according to the present embodiment.
Figure 21:
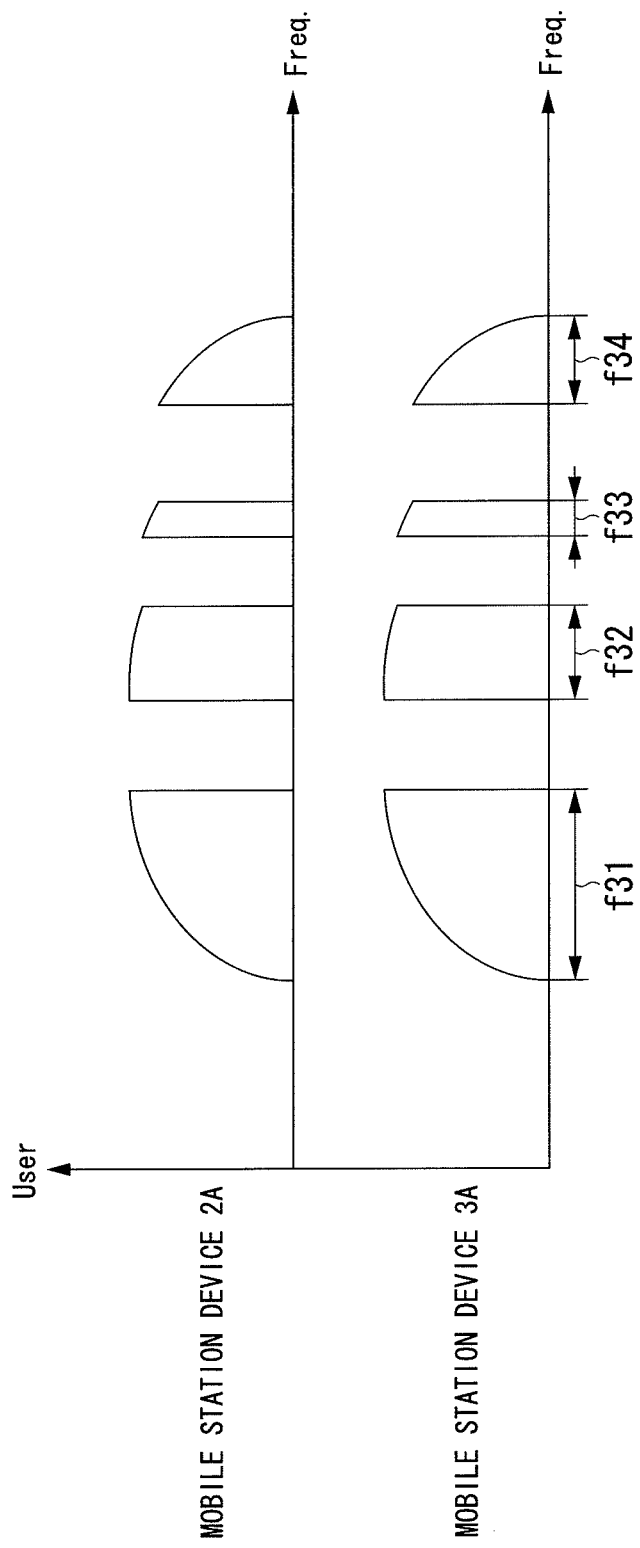
FIG. 21 is a schematic diagram illustrating another example of an allocation of signals according to the present embodiment.
Figure 22:
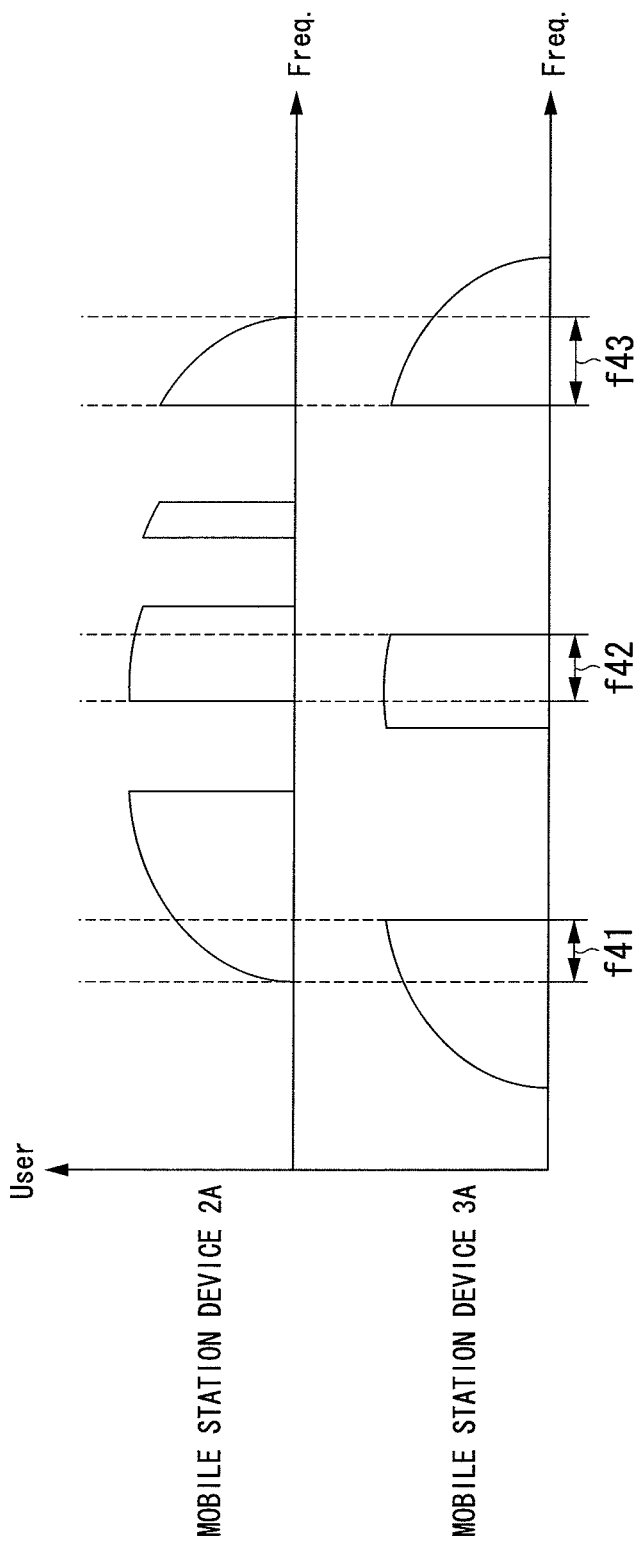
FIG. 22 is a schematic diagram illustrating another example of an allocation of signals according to the present embodiment.

FIGS. 19 to 22 are schematic diagrams illustrating examples of allocations of signals according to the third embodiment of the present invention. FIGS. 19 and 20 are diagrams when continuous frequency bands are allocated and the mobile station devices 2A and 3A arrange signals in the frequency bands. The signals of the mobile station devices 2A and 3A are arranged to overlap in a frequency band f1 in FIG. 19 and a frequency band f2 in FIG. 20. Meanwhile, FIGS. 21 and 22 are diagrams when distributive frequency bands are allocated and mobile station devices 2A and 3A arrange signals in the frequency bands. The signals of mobile station devices 2A and 3A are arranged to be overlapped in frequency bands f31 to f34 in FIG. 21 and frequency bands f41 to f43 in FIG. 22. Thus, all of the frequency bands in which the signals are arranged by the respective mobile station devices 2A and 3A may overlap or some of the frequency bands may overlap.

In the present embodiment, the base station device B1 receives a signal from each of a plurality of mobile station devices 2A and 3A, removes an IUI from the received signal, and acquires data bits from each of the mobile station devices 2A and 3A. Hereinafter, in the present embodiment, the base station device 1B is referred to as a base station device 3b. Further, since the mobile station devices 2A and 3A according to the present embodiment are the same as the mobile station device 1a according to the first embodiment, a description thereof will be omitted.

<Base Station Device 3b>

Figure 23:
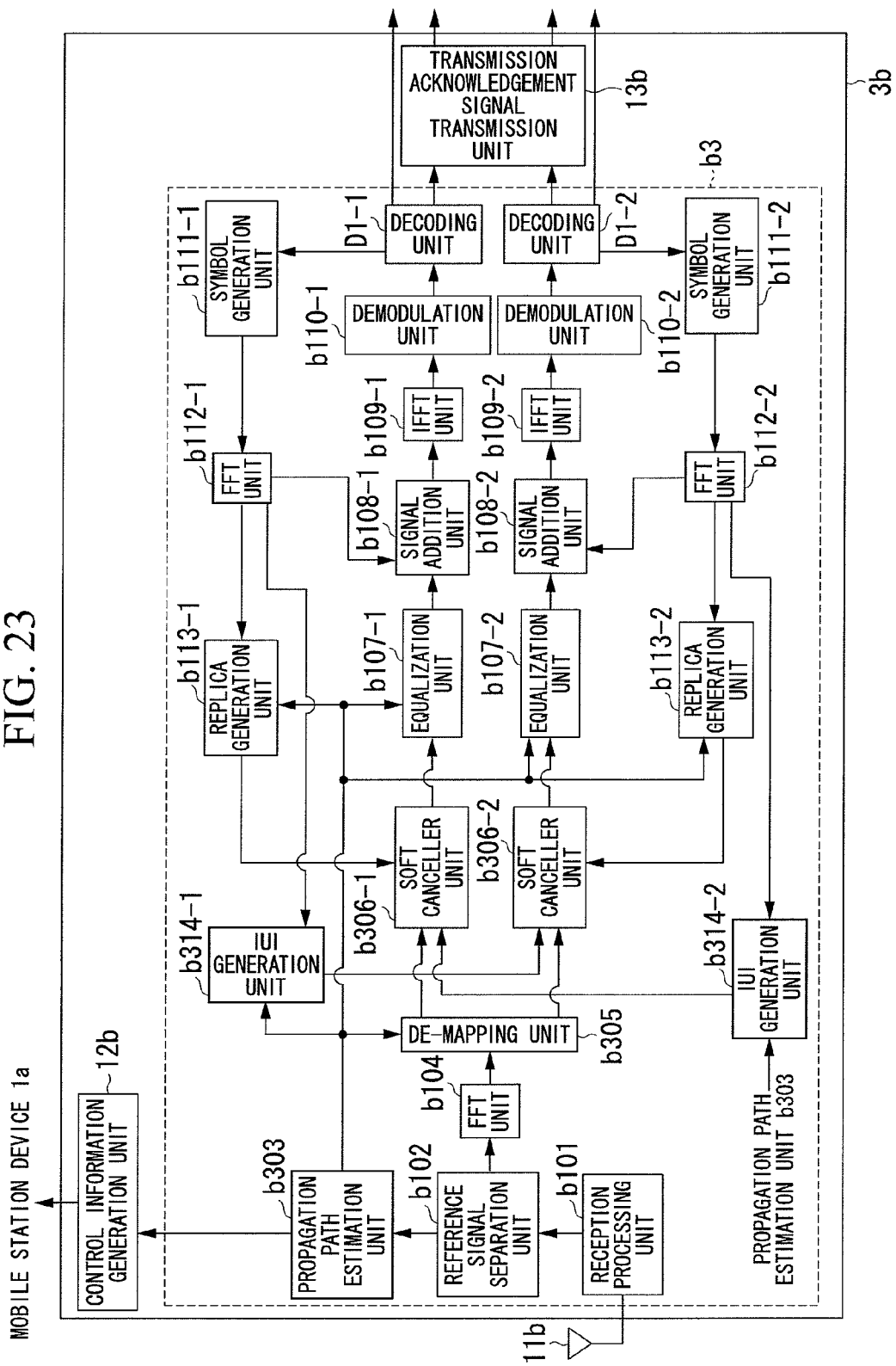
FIG. 23 is a schematic block diagram illustrating a configuration of a base station device according to the present embodiment.

FIG. 23 is a schematic block diagram illustrating a configuration of the base station device 3b according to the present embodiment. In FIG. 23, the base station device 3b includes a reception antenna 11b, a transmission device b3, a control information generation unit 12b, and a transmission acknowledgement signal transmission unit 13b. The reception device b1 includes a reception processing unit b101, a reference signal separation unit b102, a propagation path estimation unit b303, an FFT unit b104, a de-mapping unit b305, soft canceller units b306-1 and b306-2, equalization units b107-1 and b107-2, signal addition units b108-1 and b108-2, IFFT units b109-1 and b109-2, demodulation units b110-1 and b110-2, decoding units D1-1 and D1-2, symbol generation units b111-1 and b111-2, FFT units b112-1 and b112-2, replica generation units b113-1 and b113-2, and IUI generation units b314-1 and b314-2.

Here, since functions of the reception antenna 11b, the control information generation unit 12b, the reception processing unit b101, the reference signal separation unit b102, the FFT unit b104, and the transmission acknowledgement signal transmission unit 13b are the same as those in the first embodiment, a description thereof will be omitted. Further, functions of the equalization units b107-1 and b107-2 are the same as that of the equalization unit b107, functions of the IFFT units b109-1 and b109-2 are the same as that of the IFFT unit b109, and functions of the demodulation units b110-1 and b110-2 are the same as that of the demodulation unit b110. Functions of the decoding units D1-1 and 1-2 are the same as that of the decoding unit D1, functions of the symbol generation units b111-1 and b111-2 are the same as that of the symbol generation unit b111, functions of the FFT units b112-1 and b112-2 are the same as that of the FFT unit b112, and functions of the ISI generation units b113-1 and b113-2 are the same as that of the replica generation unit b113. A description of such a configuration will be omitted.

The propagation path estimation unit b303 estimates a frequency response of a propagation path (referred to as a propagation path characteristic) based on a reference signal from each of the mobile station devices 2A and 3A, which is input from the reference signal separation unit b102, and a reference signal stored in advance. The propagation path estimation unit b303 outputs propagation path characteristic information indicating the estimated propagation path characteristic to the control information generation unit 12b, the equalization units b107-1 and b107-2, the replica generation units b113-1 and b113-2, and the IUI generation units b314-1 and b314-2. Here, the propagation path estimation unit b303 outputs the propagation path characteristic information for the mobile station device 2A to the replica generation unit b113-1 and the IUI generation unit b314-1, and outputs the propagation path characteristic information for the mobile station device 3A to the replica generation unit b113-2 and the IUI generation unit b314-2.

The de-mapping unit b305 extracts (de-maps) the signal input from the FFT unit b104, from each band, based on the band allocation information input from the control information generation unit 12b. However, when the decoding unit D1-1 or D1-2 has determined band allocation information for a retransmission signal, the de-mapping unit b105 de-maps the signal based on the band allocation information. The de-mapping unit b305 outputs the signal from the mobile station device 2A to the soft canceller unit b106-1 and outputs the signal from the mobile station device 3A to the soft canceller unit b106-2.

The soft canceller unit b306-1 receives soft replica for the mobile station device 2A from the replica generation unit b113-1. The soft canceller unit b306-1 receives a replica signal of IUI generated for the signal from the mobile station device 2A by a signal from the mobile station device (the mobile station device 3A) other than the mobile station device 2A (referred to as IUI replica 1) from the IUI generation unit b314-2.

The soft canceller unit b306-2 receives soft replica for the mobile station device 3A from the replica generation unit b113-2. The soft canceller unit b306-2 receives a replica signal of IUI generated for the signal from the mobile station device 3A by a signal from the mobile station device (the mobile station device 2A) other than the mobile station device 3A (referred to as IUI replica 2) from the IUI generation unit b314-1.

The soft canceller units b306-1 and b306-2 store the signal input from the de-mapping unit b305. The soft canceller units b306-1 and b306-2 subtract the input IUI replica and soft replica from the stored signal. The soft canceller units b306-1 and b306-2 output signals from the subtraction to the equalization units b107-1 and b107-2, respectively.

The IUI generation units b314-1 and b314-2 receive the propagation path characteristic information from the propagation path estimation unit b303. Further, the IUI generation units b314-1 and b314-2 receive symbol replica in the frequency domain from the FFT units b112-1 and b112-2, respectively.

The IUI generation units b314-1 and b314-2 generate IUI replicas 2 and 1 from the input symbol replica based on the input propagation path characteristic information. The IUI generation units b314-1 and b314-2 output the generated IUI replicas 2 and 1 to the soft canceller units b306-1 and b306-2, respectively.

Thus, according to the present embodiment, it is possible to improve communication quality even when the signals overlap in the frequency band. For example, as a constraint length shorter than the constraint length used in past communication is used, the communication system can converge the turbo equalization when the retransmission has been performed without converging the turbo equalization due to signals overlapping in the frequency band, and improve the communication quality.

<Variant 7>

In the present variant 7, a case in which the retransmission control determination unit D610 selects the constraint length according to the number of users whose signals overlap will be described. The retransmission control determination unit D109 according to the present variant 7 stores a constraint length table (FIG. 24) in advance.

Figure 24:
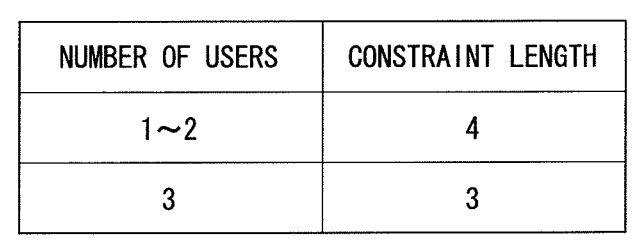

FIG. 24 is a schematic diagram illustrating an example of the constraint length table according to variant 7. As shown, the constraint length table has columns of items: the number of users indicating the number of mobile station devices 1a whose signals overlap and the constraint length. The constraint length table is two-dimensional table-format data including rows and columns in which information indicating the constraint length is stored for each user. In FIG. 24, for example, when the number of users is "1" to "2," the constraint length "4" is associated therewith, and when the number of transmissions is "3" or more, the constraint length "3" is associated therewith. In other words, as the number of users increases, the constraint length is shortened.

Further, in the third embodiment, the retransmission control determination unit D610 may select the constraint length according to a bandwidth in which signals overlap or the number of antennas used by the base station device, a modulation scheme used for transmission, and a coding rate. Examples in which the constraint length is short include a case in which the bandwidth in which signals overlap is wide, a case in which the number of antennas used for reception is small, a case in which a modulation levels is high, a case in which a coding rate is high, and the like.

Further, while the case in which signals from a plurality of mobile station devices 1a overlap has been described in the third embodiment, the present invention is not limited thereto and may be applied to a case in which signals from different antennas overlap in the communication system.

(Fourth Embodiment)

Hereinafter, a fourth embodiment of the present invention will be described in detail with reference to the drawings. In the present embodiment, a case in which a mobile station device deletes (clips) a part of a signal and transmits a resultant signal will be described.

Figure 25:
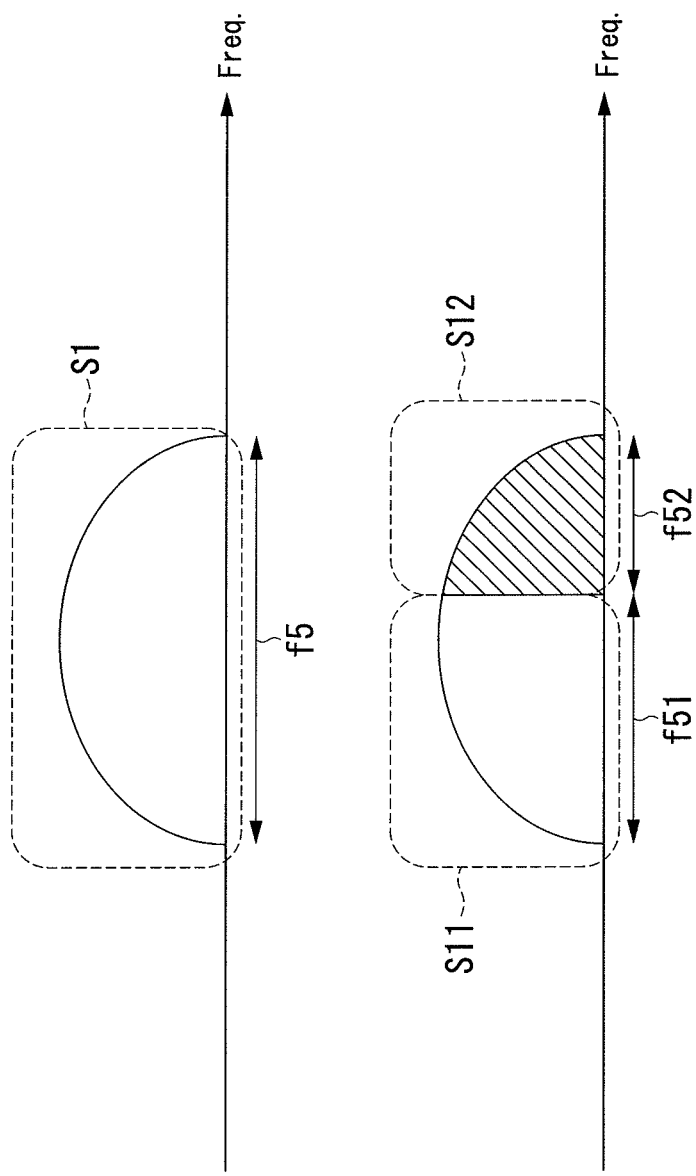
FIG. 25 is an illustrative diagram illustrating a clipping process according to a fourth embodiment of the present invention.

FIG. 25 is an illustrative diagram illustrating a clipping process according to the fourth embodiment of the present invention. In FIG. 25, a signal spectrum S1 (a frequency band f5) is a signal spectrum when the clipping process is not performed. On the other hand, a signal spectrum S11 (a frequency band f51) is a signal spectrum when the clipping process is not performed. In other words, a signal spectrum S12 (a frequency band f52) is deleted by the clipping process.

Hereinafter, in the present embodiment, mobile station devices 2A and 3A are referred to as a mobile station device 4a, and the base station device 1B is referred to as a base station device 4b.

<Mobile Station Device 4a>

Figure 26:
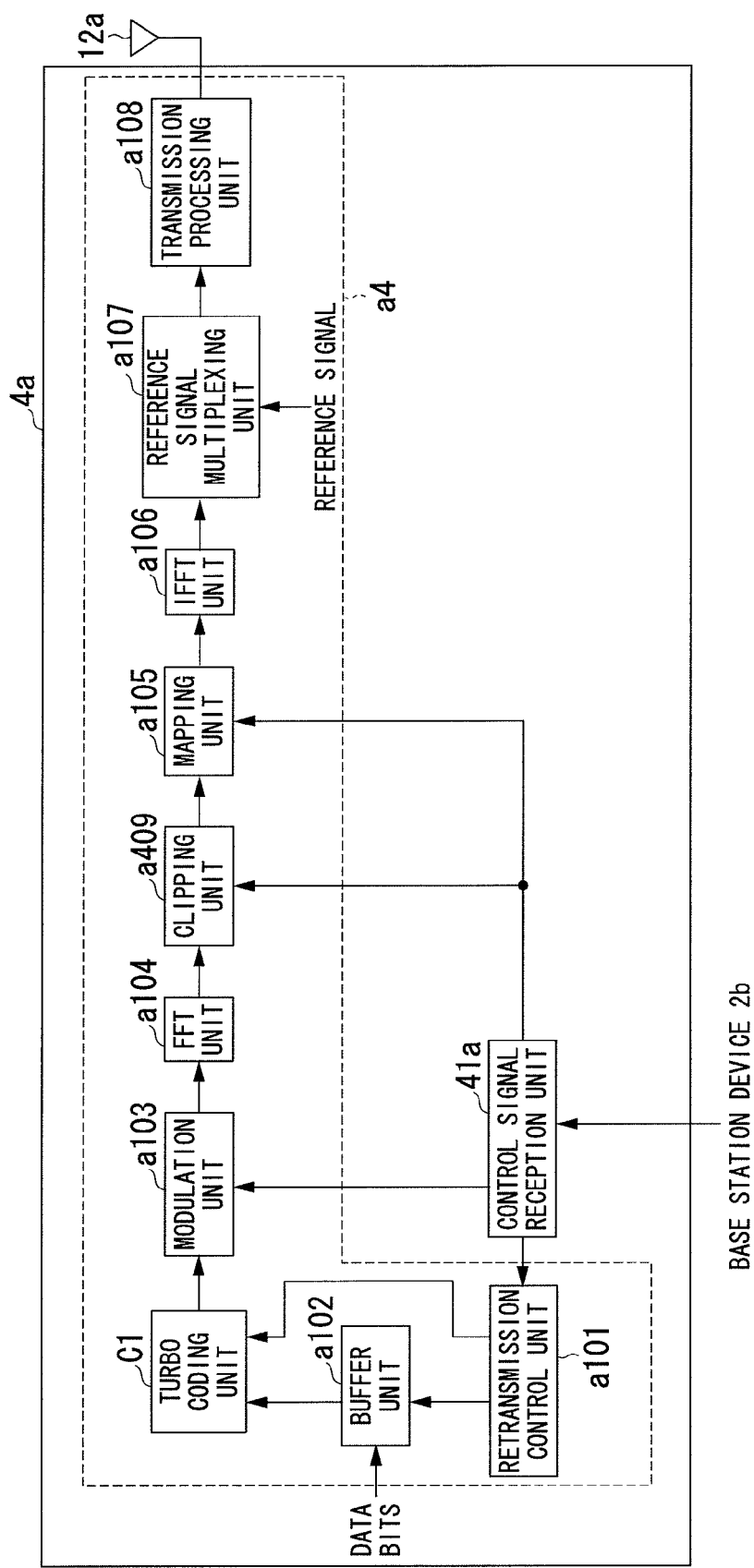
FIG. 26 is a schematic block diagram illustrating a configuration of a mobile station device according to the present embodiment.

FIG. 26 is a schematic block diagram illustrating a configuration of the mobile station device 4a according to the present embodiment. If the mobile station device 4a (FIG. 26) according to the present embodiment is compared with the mobile station device 1a (FIG. 2) according to the first embodiment, a control information reception unit 41a and a clipping unit a409 of a transmission device a4 are different. However, functions of other components (a transmission antenna 12a, a retransmission control unit a101, a buffer unit a102, a turbo coding unit C1, a modulation unit a103, an FFT unit a104, a mapping unit a105, an IFFT unit a106, a reference signal multiplexing unit a107, and a transmission processing unit a108) are the same as those in the first embodiment. A description of the same functions as those in the first embodiment will be omitted.

The control information reception unit 41a has the following functions, in addition to the function of the control signal reception unit 11a of the first embodiment. The control signal reception unit 11a receives control information containing clipping information indicating a frequency band (in the example of FIG. 25, the frequency band f52) to be clipped, and retransmission control information. The control information reception unit 41a outputs the received clipping information and band allocation information to the clipping unit a409 and the mapping unit a105.

The clipping unit a409 replaces a frequency signal indicated by the clipping information input from the control information reception unit 41a with "0" (null) based on the band allocation information input from the control information reception unit 41a, i.e., deletes the signal (a clipping process). The clipping unit a409 outputs a signal after replacement to the mapping unit a105.

Through this clipping process, a signal can be transmitted with a narrow bandwidth as compared to a case in which the clipping process is not performed.

<Base Station Device 4b>

Figure 27:
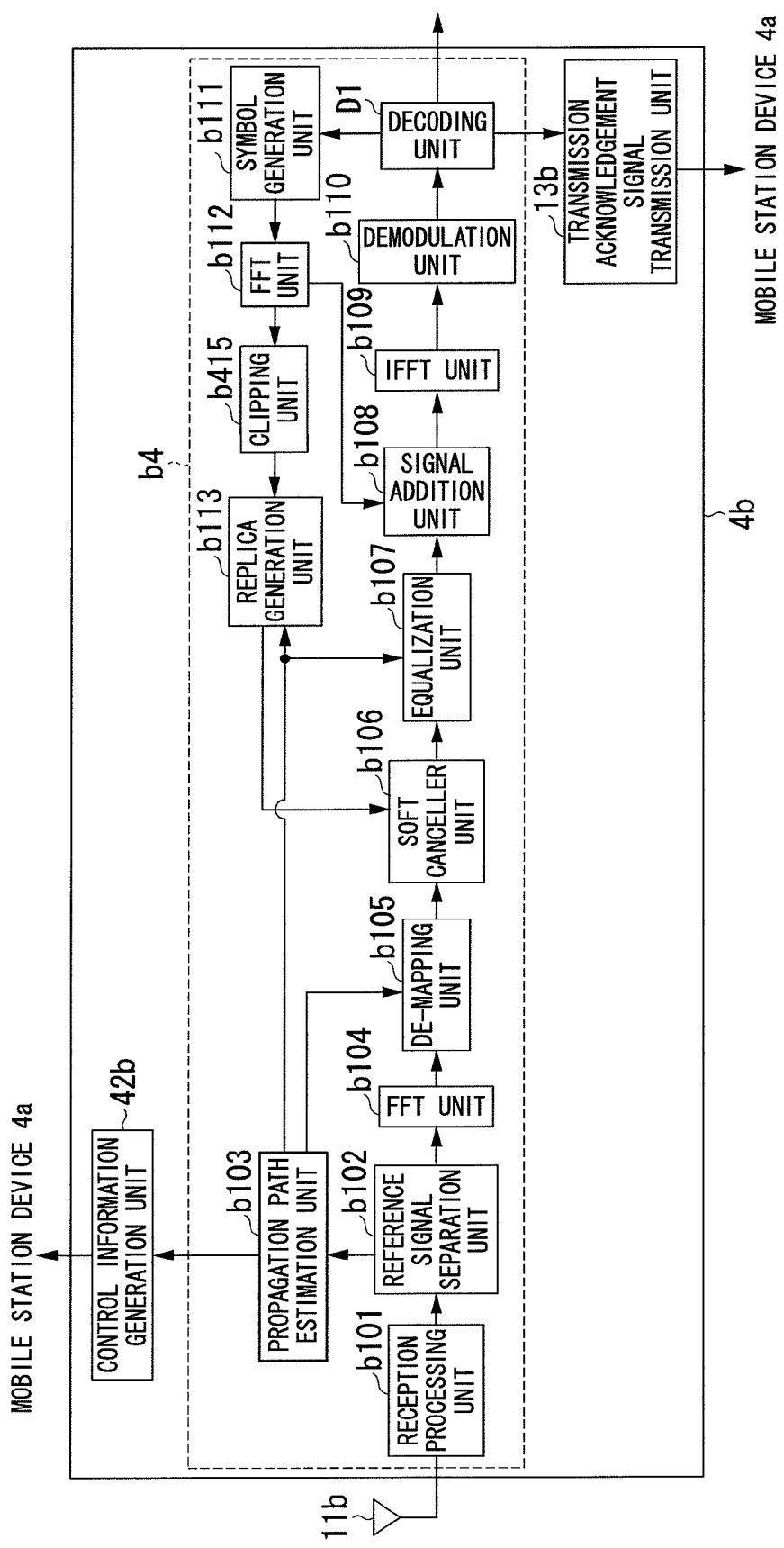
FIG. 27 is a schematic block diagram illustrating a configuration of a base station device according to the present embodiment.

FIG. 27 is a schematic block diagram illustrating a configuration of the base station device 4b according to the present embodiment. If the base station device 4b (FIG. 27) according to the present embodiment is compared with the base station device 1b (FIG. 6) according to the first embodiment, a control information generation unit 42b, and a clipping unit b415 of a reception device b4 are different. However, functions of other components (a reception antenna 1ib, a transmission acknowledgement signal transmission unit 13b, a reception processing unit b101, a reference signal separation unit b102, a propagation path estimation unit b103, an FFT unit b104, a de-mapping unit b105, a soft canceller unit b106, an equalization unit b107, a signal addition unit b108, an IFFT unit b109, a demodulation unit b110, a decoding unit D1, a symbol generation unit b111, an FFT unit b112, and a replica generation unit b113) are the same as those in the first embodiment. A description of the same functions as those in the first embodiment will be omitted.

The control information generation unit 42b has the following functions, in addition to the function of the control information generation unit 12b of the first embodiment. The control information generation unit 42b determines a frequency band to be clipped based on the propagation path characteristic indicated by the information input from the propagation path estimation unit b103. The control information generation unit 42b generates clipping information indicating the determined frequency band, and notifies the mobile station device 1a of control information containing the generated clipping information. Further, the control information generation unit 42b outputs the generated clipping information and band allocation information to the clipping unit b415.

The clipping unit b415 replaces a signal arranged in a frequency band indicated by the clipping information input from the control information generation unit 42b with "0" (null) based on the band allocation information input from the control information generation unit 42b. The clipping unit a409 outputs a signal after the replacement to the replica generation unit a113.

Thus, according to the present embodiment, it is possible to improve the communication quality even when clipping is performed. For example, as a constraint length shorter than the constraint length used for past communication is used, the communication system can converge the turbo equalization when the retransmission has been performed without converging the turbo equalization by clipping, and improve communication quality.

<Variant 8>

Further, in the fourth embodiment, the retransmission control determination unit D109 may select the constraint length according to a size of a band to be clipped. In this case, for example, the retransmission control determination unit D109 selects a shorter constraint length as the size of a band to be clipped is greater.

Further, the retransmission control determination unit D109 may select the constraint length according to a size of a band not to be clipped. In this case, for example, the retransmission control determination unit D109 selects a shorter constraint length as the size of a band to be clipped is smaller. Further, the constraint length may be determined in consideration of any or all of the number of antennas used by the base station device, a modulation scheme used for transmission, and a coding rate, in addition to the band to be clipped.

<Variant 9>

Further, the case in which the constraint length is shorter than or the same as the constraint length in the past transmission when the number of transmissions increases has been described in each of the embodiments. However, the present invention is not limited thereto, and in a communication system, when the number of transmissions increases, the constraint length may be longer than the constraint length in a past transmission.

The coding scheme selection unit C113 and the retransmission control determination unit D109 according to the present variant 9 store a constraint length table (FIG. 28) in advance.

FIG. 28 is a schematic diagram illustrating an example of the constraint length table according to variant 9. As shown, the constraint length table has columns of items: the number of transmissions and the constraint length. The constraint length table is two-dimensional table-format data including rows and columns in which information indicating the constraint length is stored for each of the numbers of transmissions. In FIG. 28, n is a natural number. In FIG. 28, for example, when the number of transmissions is "1," the constraint length "3" is associated therewith, and when the number of transmissions is "2" or more, the constraint length "4" is associated therewith.

Thus, in the present variant 9, the constraint length used for the retransmission signal is a constraint length longer than the constraint length used in the past transmission. Accordingly, in the present variant 9, a reception characteristic can be improved and communication quality can be improved.

<Variant 10>

Further, in each embodiment, different constraint lengths may be alternately used in the communication system.

The coding scheme selection unit C113 and the retransmission control determination unit D109 according to the present variant 10 store a constraint length table (FIG. 29) in advance.

FIG. 29 is a schematic diagram illustrating an example of the constraint length table according to variant 10. As shown, the constraint length table has columns of items: the number of transmissions and the constraint length. The constraint length table is two-dimensional table-format data including rows and columns in which information indicating the constraint length is stored for each of the numbers of transmissions. In FIG. 29, n is a natural number. In FIG. 29, for example, when the number of transmissions is an odd number "1," a constraint length "4" is associated therewith, and when the number of transmissions is an even number "2," the constraint length "3" is associated therewith. Further, for example, when the number of transmissions is an odd number "3," the constraint length "4" is associated therewith.

Thus, in the present variant 10, the different constraint lengths are alternately used. Accordingly, in the present variant 10, improving convergence of the turbo equalization by making the constraint length short and improving a reception characteristic by making the constraint length long can be selectively applied, and the communication quality can be improved based on such diversity.

<Variant 11>

Further, the case in which the two constraint lengths are used in the communication system has been described in each embodiment. However, the present invention is not limited thereto and three or more constraint lengths may be used. In this case, the turbo coding unit C1 includes three or more coding units having different constraint lengths, and the decoding unit D1 includes three or more decoding units having different constraint lengths.

The coding scheme selection unit C113 and the retransmission control determination unit D109 according to present variant 11 store a constraint length table (FIG. 30) in advance.

FIG. 30 is a schematic diagram illustrating an example of the constraint length table according to variant 11. As shown, the constraint length table has columns of items: the number of transmissions and the constraint length. The constraint length table is two-dimensional table-format data including rows and columns in which information indicating the constraint length is stored for each of the numbers of transmissions. In FIG. 30, for example, when the number of transmissions is "1," the constraint length "5" is associated therewith, and when the number of transmissions is "2" to "4," the constraint length "4" is associated therewith. Further, for example, when the number of transmissions is "5" or more, the constraint length "3" is associated therewith.

Further, while the case in which the transmission devices a1, a2 and a4 include one transmission antenna has been described in the respective embodiments, the present invention is not limited thereto and the transmission devices a1, a2 and a4 may include a plurality of transmission antennas. Further, while the case in which the reception devices b1 to b4 include one transmission antenna has been described in the respective embodiment, the present invention is not limited thereto and the reception devices b1 to b4 may include a plurality of transmission antennas. Further, the transmission devices a1, a2 and a4 and the reception devices b1 to b4 may perform data transmission of MIMO transmission.

Further, in the respective embodiments, the mobile station devices 1a, 2a and 4a and the base station devices 1b to b4 may store the above constraint length table as each constraint length pattern. In this case, the base station devices 1b to b4 transmit identification information for identifying the constraint length pattern to the mobile station devices 1a, 2a and 4a. The base station devices 1b to b4 and the mobile station devices 1a, 2a and 4a change the constraint length based on the constraint length pattern indicated by this identification information.

Further, the base station devices 1b to b4 may transmit this identification information in a procedure of connection with the mobile station devices 1a, 2a and 4a or may transmit the identification information in communication.

Further, uplink communication from the mobile station devices 1a, 2a and 4a to the base station devices 1b to b4 has been described in the respective embodiments. However, the present invention is not limited thereto and may be applied to downlink communication from the base station devices 1b to b4 to the mobile station devices 1a, 2a and 4a. In this case, the base station devices 1b to b4 include the transmission devices a1, a2 and a4, and the mobile station devices 1a, 2a and 4a include the reception devices b1 to b4. However, in this case, the base station devices 1b to b4 may include the control information generation unit 12b, the propagation path estimation unit b103, the control information generation unit 12b, the retransmission control determination unit D109, and the transmission acknowledgement signal transmission 13b. Further, in this case, the control information generation unit 12b and the retransmission control determination unit D109 of the base station devices 1b to b4 may determine the control information and the retransmission control information based on propagation characteristic information notified of by the mobile station devices 1a, 2a and 4a.

Further, some of the mobile station devices 1a, 2a and 4a or the base station devices 1b to b4 in the embodiment described above, such as the retransmission control unit a101, the turbo coding units C1, C3 and C4, the modulation unit a103, the FFT unit a104, the mapping unit a105, the IFFT unit a106, the reference signal multiplexing unit a107, the transmission processing unit a108, the clipping unit a409, the CRC addition units C111 and C411, the interleaver C112, the first interleavers C3121 and C4121, the second interleaver C3122, the coding scheme selection units C113 and C313, the first coding unit C114, the second coding unit C115, the third coding unit C116, the puncturing unit C117, the coded bit output unit C118, the control information generation units 12b and 42b, the transmission acknowledgement signal transmission unit 13b, the reception processing unit b101, the reference signal separation unit b102, the propagation path estimation units b103 and b303, the FFT unit b104, the de-mapping units b105 and b305, the soft canceller units b106, b306-1 and b306-2, the equalization units b107, b107-1 and b107-2, the signal addition units b108, b108-1 and b108-2, the IFFT units b109, b109-1 and b109-2, the demodulation units b110, b110-1 and b110-2, the decoding units D1, D2, D3, D4, D5, and D6, the symbol generation unit b111, b111-1, and b111-2, the FFT units b112, b112-1, and b112-2, the replica generation units b113, b113-1, and b113-2, the IUI generation units b314-1 and b314-2, the clipping unit b415, the de-puncturing unit D101, the first decoding unit D102, the interleaver D103, the decoding control units D104 and D404, the second decoding units D105, D305 and D405, the third decoding units D106 and D506, the de-interleaver D107, the first de-interleaver D3071, the second de-interleavers D3072 and D5072, the error determination unit D108, and the retransmission control determination unit D109 may be realized by a computer. In this case, a program for realizing this control function may be recorded in a computer-readable recording medium. The program recorded in the recording medium may be read and executed by a computer system. Further, the "computer system" cited herein is a computer system embedded in the mobile station devices 1a, 2a and 4a and the base station devices 1b to b4 and includes an OS or hardware such as peripheral devices. Further, the "computer-readable recording medium" refers to a portable medium such as a flexible disk, a magnetic optical disc, a ROM or a CD-ROM, or a storage unit such as a hard disk embedded in the computer system. The "computer-readable recording medium" also includes a recording medium that dynamically holds a program for a short time, like a communication line in a case in which the program is transmitted via a network such as the Internet or a communication line such as a telephone line, or a recording medium that holds a program for a certain time, like a volatile memory in the computer system including a server and a client in the above case. Further, the program may be a program for realizing some of the above-described functions or a program capable of realizing the above-described functions through a combination with a program already recorded in the computer system.

Further, some or all of the mobile station devices 1a, 2a and 4a and the base station devices 1b to b4 in the embodiments described above may be realized as an integrated circuit as LSI (Large Scale Integration). The respective functional blocks of the mobile station devices 1a, 2a and 4a and the base station devices 1b to b4 may be individually realized as a processor or some or all of the functional blocks may be integrated and realized as a processor. Further, the integrated circuit is not limited to the LSI and may be realized by a dedicated circuit or a general-purpose processor. Further, if integrated circuit technology to substitute the LSI appears with the advance of semiconductor technology, an integrated circuit by such technology may be used.

While the embodiments of the present invention have been described above with reference to the drawings, a concrete configuration is not limited to the embodiments and, for example, design changes without departing from the scope and spirit of the present invention fall within the present invention.

INDUSTRIAL APPLICABILITY

The present invention may be used for a mobile communication system in which a portable phone device is a terminal device.

REFERENCE SIGNS LIST 1A to 3A, 1a, 2a, 4a . . . mobile station device, 1B, b1 to b4 . . . base station device, 11a, 41a . . . control signal reception unit, a1, a2, a4 . . . transmission device, 12a . . . transmission antenna, a101 . . . retransmission control unit, a102 . . . buffer unit, C1, C3, C4 . . . turbo coding unit, a103 . . . modulation unit, a104 . . . FFT unit, a105 . . . mapping unit, a106 . . . IFFT unit, a107 . . . reference signal multiplexing unit, a108 . . . transmission processing unit, a409 . . . clipping unit, C111, C411 . . . CRC addition unit, C112 . . . interleaver, C3121, C4121 . . . first interleaver, C3122 . . . second interleaver, C113, C313 . . . coding scheme selection unit, C114 . . . first coding unit, C115 . . . second coding unit, C116 . . . third coding unit, C117 . . . puncturing unit, C118 . . . coded bit output unit, C1141, C1143, C1146, C1147 . . . addition unit, C1142, C1144, C1145 . . . delay circuit, C1161, C1163, C1165 . . . addition unit, C1162, C1164 . . . delay circuit, 11b . . . reception antenna, b1 . . . reception device, 12b, 42b . . . control information generation unit, 13b . . . transmission acknowledgement signal transmission unit, b101 . . . reception processing unit, b102 . . . reference signal separation unit, b103, b303 . . . propagation path estimation unit, b104 . . . FFT unit, b105, b305 . . . de-mapping unit, b106, b306-1, b306-2 . . . soft canceller unit, b107, b107-1, b107-2 . . . equalization unit, b108, b108-1, b108-2 . . . signal addition unit, b109, b109-1, b109-2 . . . IFFT unit, b110, b110-1, b110-2 . . . demodulation unit, D1, D2, D3, D4, D5, D6 . . . decoding unit, b111, b111-1, b111-2 . . . symbol generation unit, b112, b112-1, b112-2 . . . FFT unit, b113, b113-1, b113-2 . . . replica generation unit, b314-1, b314-2 . . . IUI generation unit, b415 . . . clipping unit, D101 . . . de-puncturing unit, D102 . . . first decoding unit, D103 . . . interleaver, D104, D404 . . . decoding control unit, D105, D305, D405 . . . second decoding unit, D106, D506 . . . third decoding unit, D107 . . . de-interleaver, D3071 . . . first de-interleaver, D3072, D5072 . . . second de-interleaver, D108 . . . error determination unit, D109 . . . retransmission control determination unit.

The invention claimed is:

1. A communication system comprising a transmission device and a reception device, wherein
the transmission device comprises:
a turbo coding unit configured to code first bits for a retransmission signal, the coding being performed with a first constraint length different from a second constraint length, the second constraint length being used in a past transmission; and
a transmission processing unit configured to transmit the retransmission signal generated from the coded first bits, wherein
the turbo coding unit is configured to determine the first constraint length based on information indicating convergence of a turbo code, the information being any one of: the number of retransmissions; the number of retransmissions and a coding rate; the number of reception antennas of the reception device; a modulation level; an overlapping bandwidth; and a bandwidth to be clipped,
wherein
the reception device comprises
a decoding unit configured to perform turbo equalization using second bits decoded with a third constraint length different from a fourth constraint length, the fourth constraint length being used in a past reception, the second bits being bits of the retransmission signal.

2. A transmission device configured to transmit a signal in which bits are coded, the transmission device comprising:
a turbo coding unit configured to code the bits for a retransmission signal, the coding being performed with a first constraint length different from a second constraint length, the second constraint length being used in a past transmission; and
a transmission processing unit configured to transmit the retransmission signal generated from the coded bits, wherein
the turbo coding unit is configured to determine the first constraint length based on information indicating convergence of a turbo code, the information being any one of: the number of retransmissions; the number of retransmissions and a coding rate; the number of reception antennas of the reception device; a modulation level; an overlapping bandwidth; and a bandwidth to be clipped.

3. The transmission device according to claim 2, wherein the past transmission is an initial transmission.

4. The transmission device according to claim 2, wherein the turbo coding unit comprises:

a first coding unit configured to code the first bits with the second constraint length; and a second coding unit configured to code the first bits with the first constraint length, wherein the first bits of a signal in the past transmission are coded using the first coding unit, and the first bits of the retransmission signal are coded using the second coding unit.

5. The transmission device according to claim 2, wherein the transmission device is configured to code by sorting from a first bit sequence to a second bit sequence, the first bit sequence being used in the past transmission.

6. The transmission device according to claim 2, wherein the transmission device further comprises:

a first coding unit configured to code the first bits with the second constraint length; and a second coding unit configured to code the first bits with the first constraint length, wherein the first bits of a signal in the past transmission are coded using the first coding unit, and the first bits of the retransmission signal are coded using the second coding unit, the first bits of the retransmission signal being obtained by sorting from the first bit sequence to the second bit sequence.

7. The transmission device according to claim 2, wherein the first constraint length is shorter than the second constraint length.

8. A communication system comprising a transmission device and a reception device, wherein the transmission device comprises:

a turbo coding unit configured to code first bits for a retransmission signal, the coding being performed with a first constraint length different from a second constraint length, the second constraint length being used in a past transmission; and a transmission processing unit configured to transmit the retransmission signal generated from the coded first bits, wherein the turbo coding unit is configured to determine the first constraint length based on information indicating convergence of a turbo code, the information being any one of: the number of retransmissions; the number of retransmissions and a coding rate; the number of reception antennas of the reception device; a modulation level; an overlapping bandwidth; and a bandwidth to be clipped, wherein the reception device comprises:

a decoding unit configured to perform turbo equalization using bits decoded with a first constraint length different from a second constraint length, the second constraint length being used in a past reception, the bits being bits of the retransmission signal;

a first decoding unit configured to decode the bits with the second constraint length;

a second decoding unit configured to decode the bits with the first constraint length; and a third decoding unit configured to decode the bits with a third constraint length, wherein the reception device is configured to decode by sorting from a first bit sequence to a second bit sequence, the first bit sequence being used in the past reception, and the bits decoded by the first decoding unit are decoded using the second decoding unit and the third decoding unit, and decoding in the first decoding unit is performed using the decoded bits.

9. The communication system according to claim 8, wherein the decoding unit comprises:

a first decoding unit configured to decode the second bits with the fourth constraint length;

a second decoding unit configured to decode the second bits with the third constraint length; and a decoding control unit configured to output the second bits of a signal in the past reception to the first decoding unit and output the second bits of the retransmission signal to the second decoding unit.

10. The communication system according to claim 8, wherein the decoding unit comprises:

a first decoding unit configured to decode the second bits with the fourth constraint length; and a second decoding unit configured to decode the second bits with the third constraint length, wherein the first decoding unit and the second decoding unit are connected in series.

11. The communication system according to claim 8, wherein the reception device further comprises:

a first decoding unit configured to decode the second bits with the fourth constraint length; and a second decoding unit configured to decode the second bits with the third constraint length, wherein the second bits of a signal in the past reception are decoded using the first decoding unit, and the second bits of the retransmission signal are decoded using the second decoding unit, the second bits of the retransmission signal being obtained by sorting from the second bit sequence to the first bit sequence.

* * * * *